(12) United States Patent
Ledenev et al.

(10) Patent No.: US 9,366,714 B2
(45) Date of Patent: Jun. 14, 2016

(54) ABNORMALITY DETECTION ARCHITECTURE AND METHODS FOR PHOTOVOLTAIC SYSTEMS

(75) Inventors: Anatoli Ledenev, Fort Collins, CO (US); Wesley R. Fuller, Fort Collins, CO (US); Robert M. Porter, Wellington, CO (US)

(73) Assignee: AMPT, LLC, Fort Collins, CO (US)

( * ) Notice: Subject to any disclaimer, the term of this patent is extended or adjusted under 35 U.S.C. 154(b) by 501 days.

(21) Appl. No.: 13/981,062

(22) PCT Filed: Jan. 23, 2012

(86) PCT No.: PCT/US2012/022266
§ 371 (c)(1),
(2), (4) Date: Aug. 13, 2013

(87) PCT Pub. No.: WO2012/100263
PCT Pub. Date: Jul. 26, 2012

(65) Prior Publication Data
US 2013/0307556 A1    Nov. 21, 2013

Related U.S. Application Data

(60) Provisional application No. 61/435,148, filed on Jan. 21, 2011.

(51) Int. Cl.
*G01R 31/02* (2006.01)
*H02S 50/10* (2014.01)

(52) U.S. Cl.
CPC .............. *G01R 31/025* (2013.01); *H02S 50/10* (2014.12)

(58) Field of Classification Search
CPC ............................ G01R 31/025; H02S 50/10
USPC .................................................. 324/509, 522
See application file for complete search history.

(56) References Cited

U.S. PATENT DOCUMENTS

| 7,605,498 B2 | 10/2009 | Ledenev et al. |
| 7,719,140 B2 | 5/2010 | Ledenev et al. |

(Continued)

FOREIGN PATENT DOCUMENTS

| WO | 2009051853 A1 | 4/2009 |
| WO | 2009051854 A1 | 4/2009 |

(Continued)

OTHER PUBLICATIONS

U.S. Appl. No. 61/536,440, filed Sep. 19, 2011, entitled Improved Solar Power System Data Handling Methods.

(Continued)

*Primary Examiner* — Vincent Q Nguyen
(74) *Attorney, Agent, or Firm* — Santangelo Law Offices, P.C.

(57) ABSTRACT

One aspect of the inventive technology disclosed herein, in certain embodiments, may involve the determination of at least one measured, instantaneous intra-string current difference for each of the power generating string, and the use of such determinations to assess the existence of leakage current, a frequent ground fault predecessor, thereby enabling preclusion of a ground fault that would otherwise result. Certain methods and detection architecture may enable precise abnormality location, e.g., enabling the identification of which solar module assembly in particular is faulty. Another aspect relates generally, in certain embodiments, to detection circuit architecture operable to sequentially impress a leakage current inducing voltage upon each rail of a photovoltaic system. Another relates generally, in certain embodiments, to the use of at least one current interrupter at each end of a string to preclude flow therethrough in the event of e.g., unintended field reversal.

40 Claims, 17 Drawing Sheets

(56) References Cited

U.S. PATENT DOCUMENTS

| | | |
|---|---|---|
| 7,843,085 B2 | 11/2010 | Ledenev et al. |
| 2008/0147335 A1 | 6/2008 | Adest et al. |
| 2009/0141522 A1 | 6/2009 | Adest et al. |
| 2009/0206666 A1 | 8/2009 | Sella et al. |
| 2009/0207543 A1 | 8/2009 | Boniface et al. |
| 2010/0078057 A1 | 4/2010 | Karg et al. |
| 2010/0085670 A1 | 4/2010 | Palaniswami et al. |
| 2010/0229915 A1 | 9/2010 | Ledenev et al. |
| 2010/0246230 A1 | 9/2010 | Porter et al. |
| 2010/0253150 A1 | 10/2010 | Porter et al. |
| 2010/0308662 A1 | 12/2010 | Schatz et al. |
| 2011/0005567 A1 | 1/2011 | Vandersluis et al. |
| 2011/0241719 A1* | 10/2011 | Shr .................. H02S 50/10 324/761.01 |

FOREIGN PATENT DOCUMENTS

| | | |
|---|---|---|
| WO | 2009051870 A1 | 4/2009 |
| WO | 2009055474 A1 | 4/2009 |
| WO | 2011049985 A1 | 4/2011 |

OTHER PUBLICATIONS

U.S. Appl. No. 61/435,148, filed Jul. 21, 2011, entitled Fire Prevention in Solar PV Arrays Through Detection and Elimination of Ground Faults.

International Application No. PCT/US2012/022266, International Search Report dated Jul. 24, 2012.

International Application No. PCT/US2012/022266, Written Opinion of the International Searching Authority dated Jul. 24, 2012.

* cited by examiner

String Level Detection Architecture

Inverter Level Detection Architecture

ABNORMALITY DETECTION ARCHITECTURE AND METHODS FOR PHOTOVOLTAIC SYSTEMS

CROSS REFERENCE TO RELATED APPLICATION

This application is the United States National Stage of international patent application number PCT/US2012/022266, filed 23 Jan. 2012, published on 26 Jul. 2012 as WO 2012/100263 A2 which itself claims priority to and benefit of U.S. Provisional Patent application No. 61/435,148, filed Jan. 21, 2011, and entitled "Fire Prevention In Solar PV Arrays Through Detection and Elimination of Ground Faults", each of said prior filed applications incorporated herein in its entirety.

TECHNICAL FIELD

This invention generally related to photovoltaic ("PV") power systems. Specifically, in embodiments, it relates to systems and methods to detect and address ground faulting such as can cause safety and even fire hazards and the like.

BACKGROUND

In large PV arrays there is a problem detecting ground faults and potential ground faults. Every solar PV module contributes some leakage to its frame or mounting structure. In a conventional system all these leakage currents sum into a current which may flow through a fused connection to protective earth or ground. This fuse is often located in a downstream inverter. With large numbers of modules the "normal leakage current" can often be in the range of amperes. This can mask individual issues which may create safety or reliability issues. In addition to normal leakage current, another potential problem may exist when there is a small unintended gap between conductors. For example, a pinched wire may only have a small gap between a PV rail and ground. This gap may not arc over during normal operation but it is a potential hazard. If there are unanticipated voltage changes in this rail voltage this gap may arc over. There is a well documented fire at a Target® store where some of these hazards might have contributed to the fire.

DISCLOSURE OF INVENTION

The invention described here may offer help in anticipating unwanted ground faults and potential ground faults which could be the cause of fires in PV arrays. One aspect of the inventive technology disclosed herein, the measured, instantaneous intra-string current difference determination invention, in embodiments, can make use of the architecture of distributed DC/DC converters—perhaps even one per solar PV module. Such a module assembly can be equipped with sites for accurate input and output current measurement. When these DC/DC converters have their outputs connected in a series string (which is a common architecture for building voltage), the current through each DC/DC converter should be the same—that is of course if there is no other current path. But if there is a leakage path somewhere in a string, some of the PV generated power may be shunted to this leakage path. For a simple situation it may be possible to simply compare the output current of each DC/DC converter in the string. If between two modules the current is different then there is an unwanted current path. While this is a simple case, it is clear that such current measurement per module assembly or per DC/DC converter can be very powerful in detecting unwanted current paths. In circuits whose module are not each connected with a converter, even just measuring the current from each module accurately enough could produce this result.

Of course ground faults in a PV array can sometimes present unexpectedly. A PV array may have a lower rail connected to ground through a fuse. If there were also a short from this lower voltage rail to ground it may not cause the fuse to blow. In fact it may even serve an unwanted function of shunting the current through the very fuse one wanted for a safety indicator! While it is clear some forms of faults are difficult to detect, this one can be detected. Further, once a fault on a solar array occurs, it can move that point to ground. If, for example, this was the positive rail of an array, the fault could blow the protective fuse and subsequently reverse the polarity of the whole field. Also, consider what might happen if there was also a pinched wire with a small gap. If this wire had only 40 volts on it typically, it might now have 400 volts across this small gap which can now trigger a breakdown.

Circuit architecture changes like array reversal to detect small gaps which might not arc over with only low voltage across (which may be the case during operation if the gaps are near a lower voltage rail), or to detect leakage current that might not flow under such low operational voltage, can be used as part of some embodiments. In addition, in other embodiments, switching off combiner boxes or other elements can be employed to isolate faults on the fails.

One aspect of the inventive technology disclosed herein, in certain embodiments, may involve the determination of at least one measured, instantaneous intra-string current difference for each of the power generating string, and the use of such determination(s) to assess the existence of leakage current, a frequent ground fault predecessor, thereby enabling preclusion of a ground fault that would otherwise result. Certain methods and detection architecture may enable precise abnormality location, by enabling the identification of which solar module assembly in particular is faulty. Another aspect relates generally, in certain embodiments, to detection circuit architecture operable to sequentially impress a leakage current inducing voltage upon each rail of a photovoltaic system. Another relates generally, in certain embodiments, to the use of at least one current interrupter at each end of a string to preclude flow therethrough in the event of, e.g., unintended field reversal. All various aspects of the inventive technology may be combined in any fashion, to suit the intended application.

Goals of the various aspects of the inventive technology include but are not limited to: detection of even small leakage current, thereby offering the opportunity to take corrective action before such small leakage current develops into a ground fault (and a much larger leakage, perhaps in addition to a presenting a significant safety hazard); avoidance of safety hazards posed by ground fault; high resolution leakage location detection, thereby enabling the isolation of only small power generating portions of the PV array for repair; provision of retrofittable equipment that can be applied to existing PV systems for detection; and prevention of flow of high array currents through strings that are designed to handle smaller current. Of course, not each embodiment achieves each or all of the goals mentioned above or allude to elsewhere in this description. Further other goals not particularly described immediately above may be evident from elsewhere in the specification, including the figures.

BRIEF DESCRIPTION OF THE DRAWINGS

FIG. 4 shows various measurements that may be used in one embodiment of the inventive detection technology. Whereas FIG. 3 shows determination of differences relative to each module assembly, FIG. 4 shows a lower resolution detection scheme.

FIG. 5 has an even lower location resolution than FIG. 4.

FIG. 6 also shows an ideal site for converter output for negative converter output measurement (see circled resister at the top converter).

FIG. 7 also shows, for exemplary purposes only, possible voltages input and output locations, both negative and positive.

FIG. 8 also shows possible converter current measurement sites. Whereas converter output current measurements will not indicate which substring is leaking current, converter input measurements will.

MODE(S) FOR CARRYING OUT THE INVENTION

The present invention includes a variety of aspects, which may be combined in different ways. The prior and following descriptions are provided to list elements and describe some of the embodiments of the present invention. These elements are listed with initial embodiments, however it should be understood that they may be combined in any manner and in any number to create additional embodiments. The variously described examples and preferred embodiments should not be construed to limit the present invention to only the explicitly described systems, techniques, and applications. Further, this description should be understood to support and encompass descriptions and claims of all the various embodiments, systems, techniques, methods, devices, and applications with any number of the disclosed elements, with each element alone, and also with any and all various permutations and combinations of all elements in this or any subsequent application.

Figure 1:
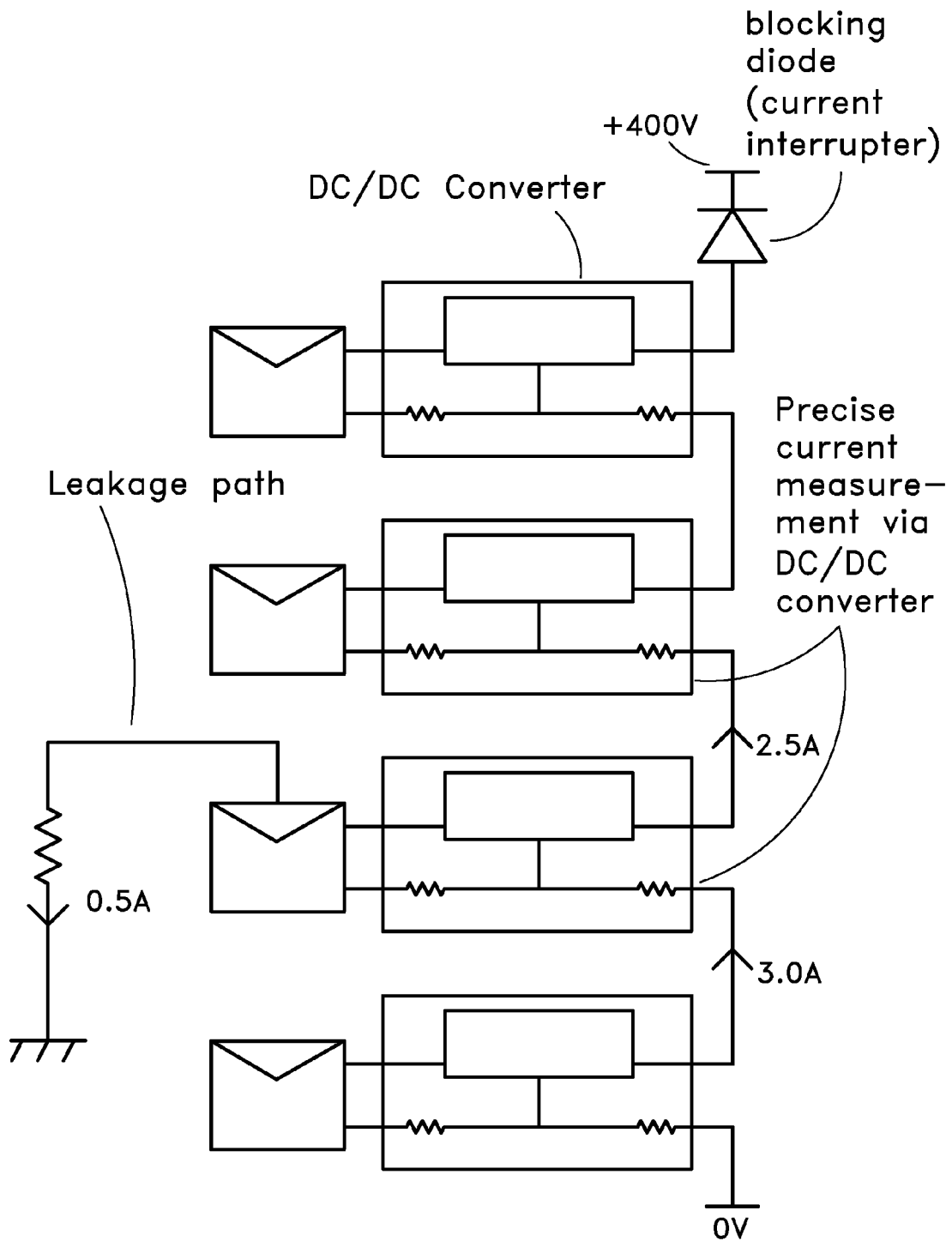
FIG. 1 shows how determination of instantaneous current difference can detect a leakage in one of many types of strings that may benefit from embodiments of the inventive detection method.
Figure 2:
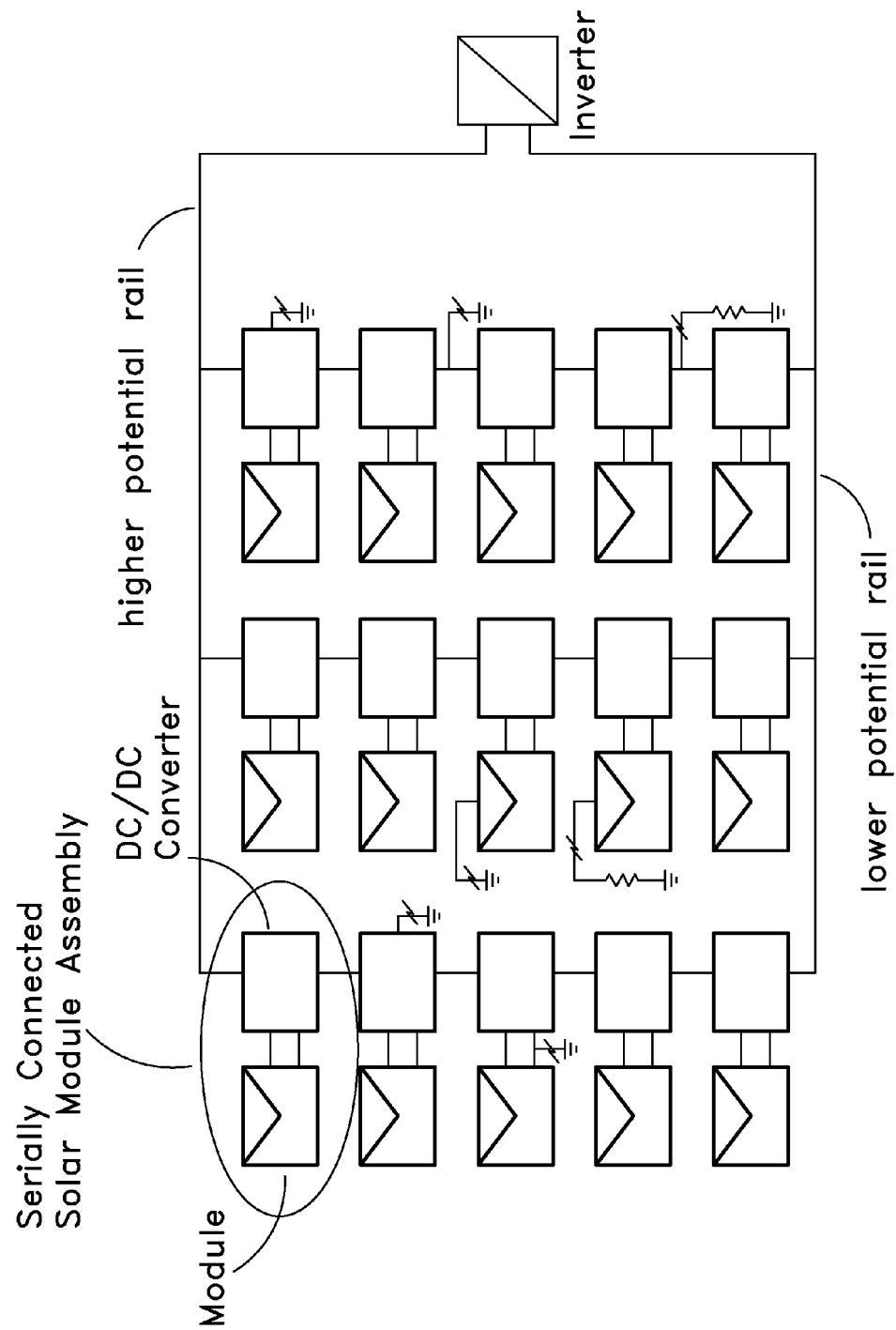
FIG. 2 shows some of the many different types of leakage current paths that will result in string current differences.
Figure 3:
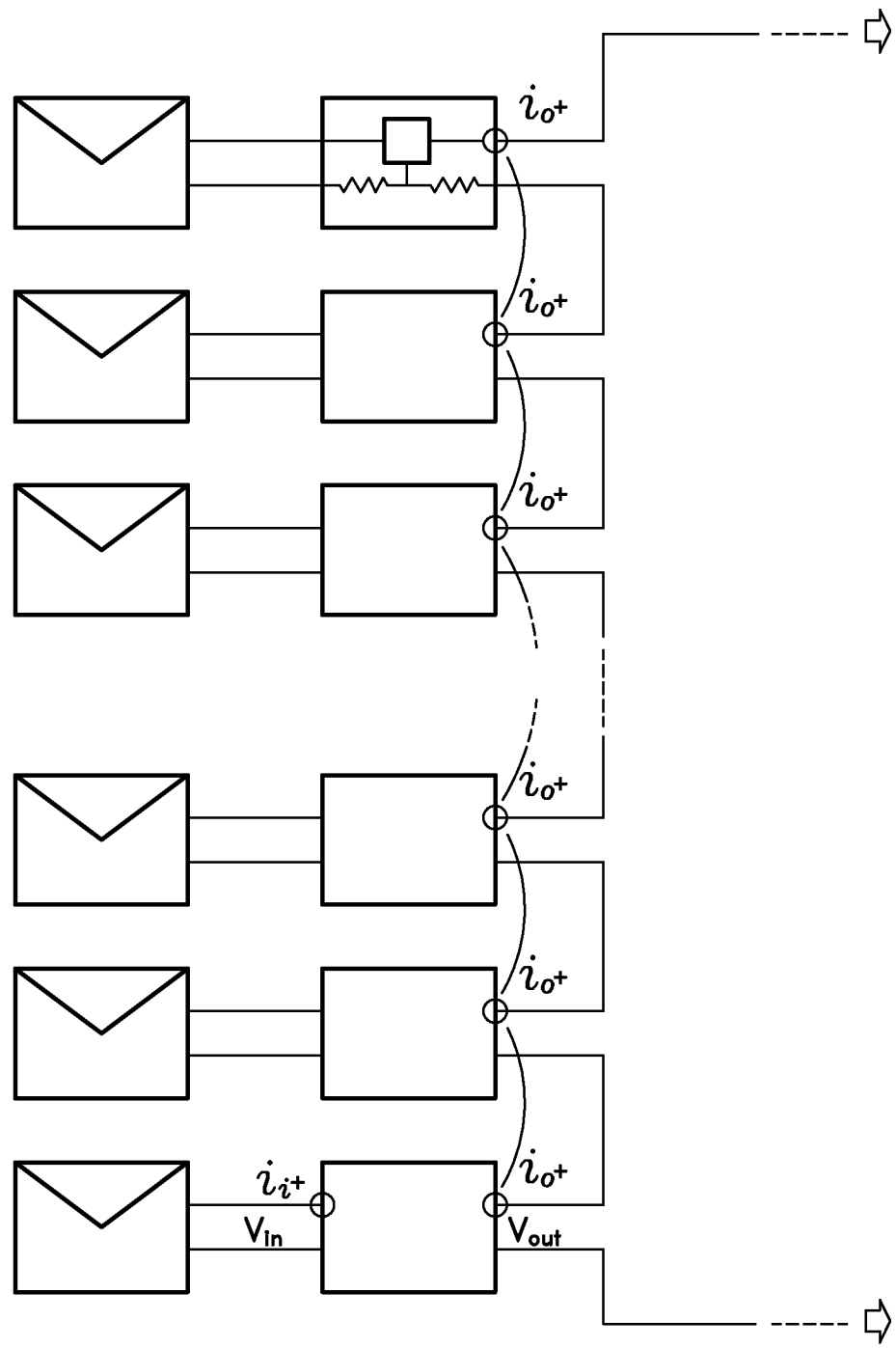
FIG. 3 shows various measurements that may be used in one embodiment of the inventive detection method; such a method may be used to pinpoint the precise serially connected solar module assembly that is leaking current. The circles at the positive converter output represent generally a current measurer such as an ammeter, or, in certain cases, hook up sites for a differential current measurer. Note that such symbols are excluded from remaining drawings, for reasons relative to clarity of presentation. The ends of the semi-circular arcs shown (in this and other figures) are ammeter measurement sites or hook up points for a differential claim measurer; measurements from such sites, or a differential claim measurer hooked up to such points, may be used to determine the difference in current between the two points. Any determined difference may represent leakage from the serially connected solar module assembly therebetween.
Figure 4:
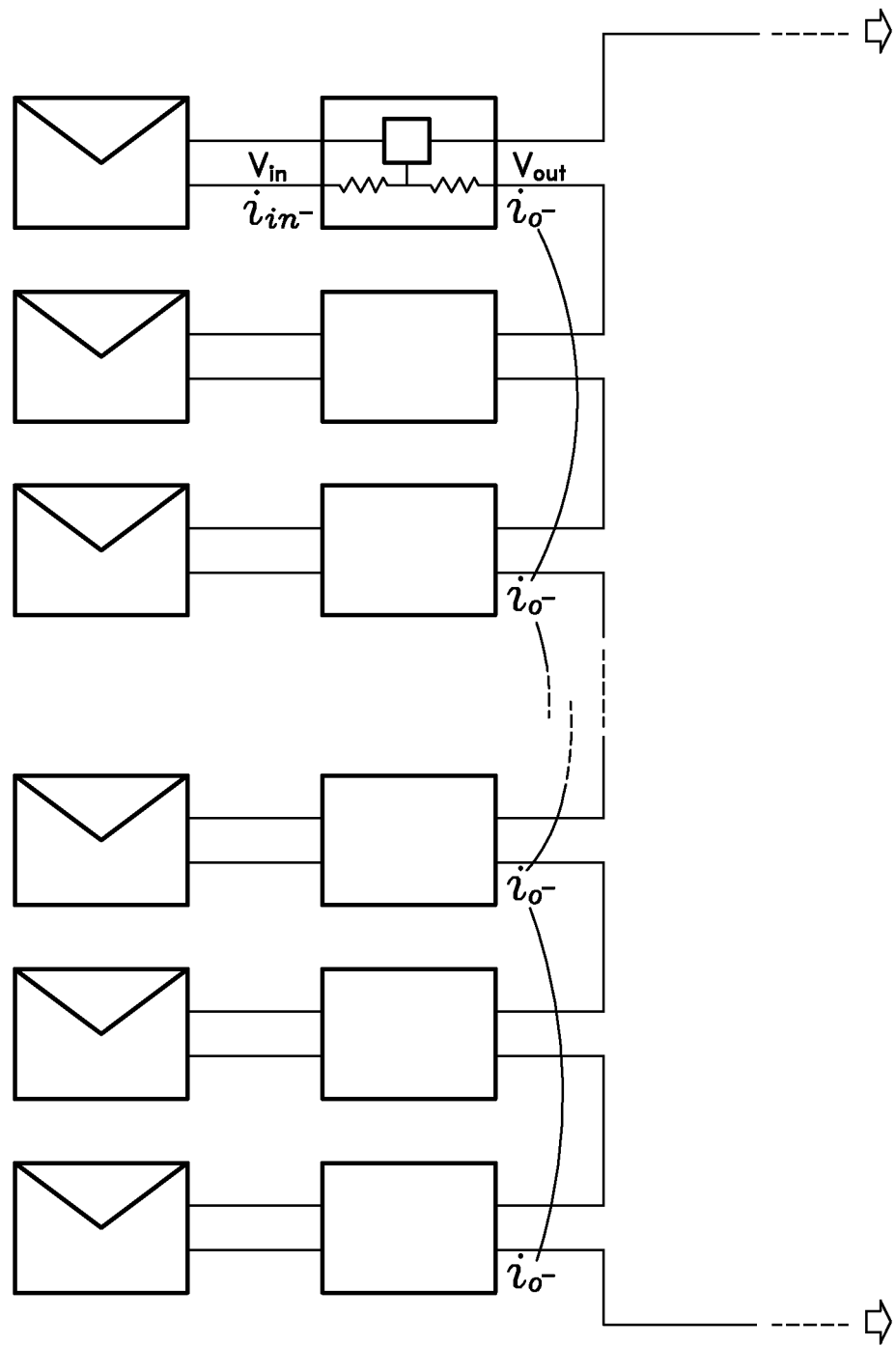
Figure 5:
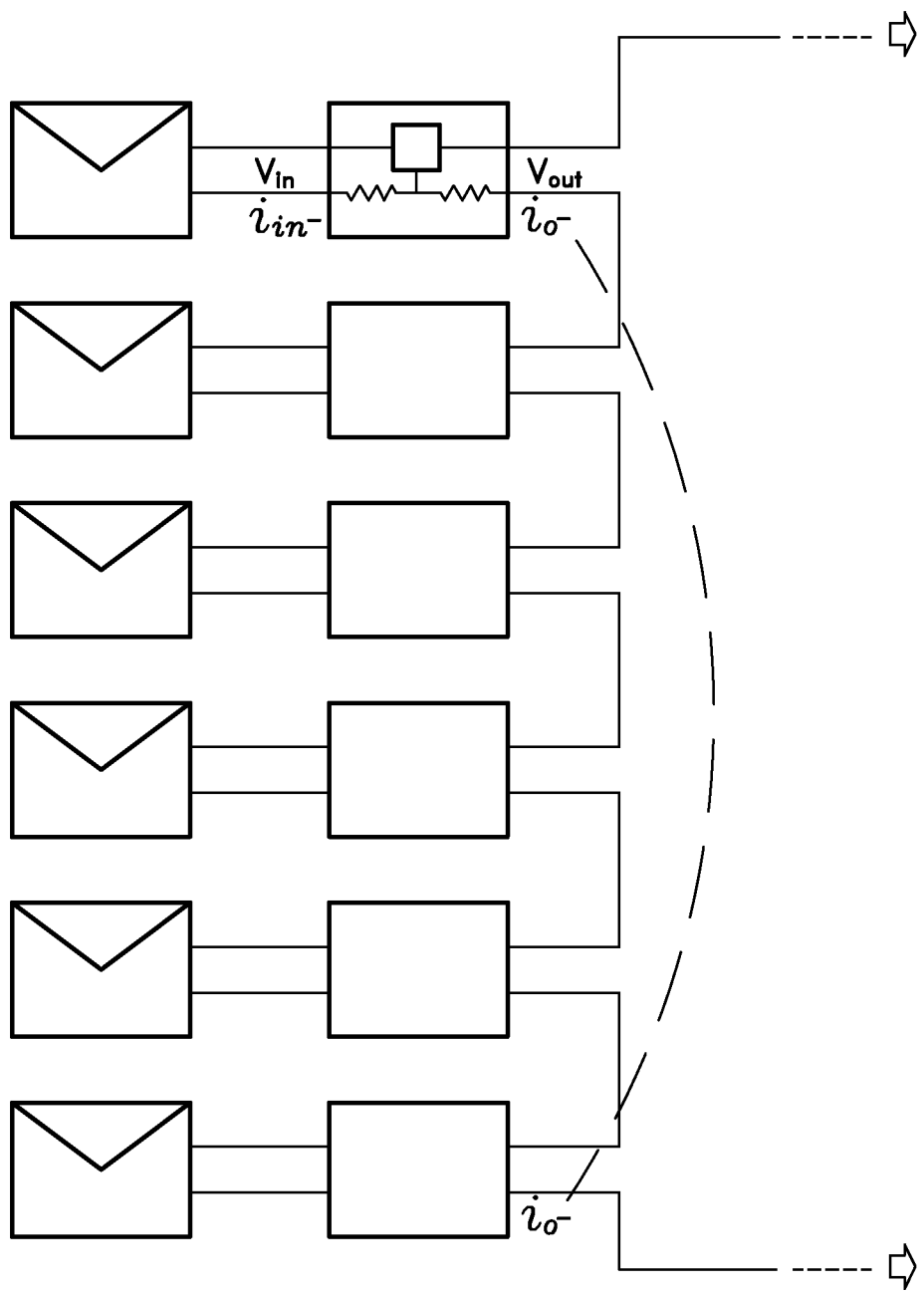
FIG. 5 shows various measurements that can be used to detect the presence of leakage current from a string.

Instantaneous Intra-String Current Differential Diagnostics:

In some embodiments, using precise current measurements at the module level via distributed DC/DC converters connected to the modules, it is possible to provide a detector to measure midstring leakage paths and accurately locate the offending module assembly. These precise measurements with DC/DC converters may be conducted via, but not limited to, elements such as a panel integrated solution and also a standalone solution. As mentioned, in a normal behaving PV system, the current in a string should be equal throughout the string. As seen in FIG. 1, however, a midstring leakage path can cause the current to be diverted away from the remainder of the string (up to the higher level rail), creating a lower current seen on such string remainder. Conventionally, without manually measuring the current on the entire array, sensing this would not have been likely. The precise measurements of current for the DC/DC converters of the solar module assemblies (in those embodiments where solar module assemblies each have a converter) can enable detection of a misdirection of current. Such may be signaled upon detection of an unusual difference in current levels between the two or more modules, between which the leakage path occurs. These leakage points can be routinely checked for to prevent an extreme situation that could cause severe damage to the PV array and the structures around it.

Precisely measured synchronous current differences can enable significant diagnostic capability for a photovoltaic system. Using synchronized data (e.g., a measured, instantaneous intra string current difference) it may be possible to analyze precisely measured intra-string current; generated data can be used to detect and determine the location of a leakage current—the common predecessor of ground faults—in a photovoltaic system. Without measurement of sufficiently instantaneous intra-string current differences, it would not be possible to reliably and accurately analyze intra-string currents and make decisions on them because of the rapidly changing behavior of a photovoltaic system. To determine whether there is a operational abnormality such as leakage current or ground fault, such as illustrated in the FIG.

2 (see the "lightning bolts", which indicate some a few of the various types of unintended loss of current from the system), it is required to determine an instantaneous delta or difference in current between two locations where the current should be the same (intra-string current). One skilled in the art will understand that in a series connection, all currents within that series should be equal until another connection, perhaps to ground is made. Such connections are, unfortunately, relatively common; they may be attributable to sub-optimal mechanical design, sub-optimal manufacturing, and/or the harsh environmental conditions to which many photovoltaic systems, and their modules (and associated componentry) are subjected. By combining precise measurements with synchronized data collection (synchronized at one of several possible different levels, as explained elsewhere here), it is possible to measure when the currents within a series connection are unintentionally not equal, and conclusions, relative to the presence of leakage current can be made accordingly. These measurements can be performed on the string level, module level, or even combiner level, but are not limited to these locations. Generally, the instantaneous, intra-string current differential diagnostic aspect of the inventive technology may be represented, in particular exemplary embodiments, in FIGS. 1-10 (in non-limiting manner).

Accordingly, at least one method of the inventive technology may be described as a method of detecting operational abnormality within a solar power array that comprises at least one power generating string, the at least one power generating string comprising a plurality of serially connected solar module assemblies. The method may include the steps of determining at least one measured, instantaneous intra-string current difference for each power generating string, where each measured, instantaneous intra-string current difference is an instantaneous difference in string current between a respective two points on the at least one power generating string; assessing the presence of the operational abnormality (e.g., any type of current drain, including leakage current, ground fault current loss, current loss attributable to arc) between the respective two points based on the at least one measured, instantaneous intra-string current difference; and repeating the steps of determining and assessing. The method may be viewed as a continual monitoring method (whether it be done once a day or several times a day, perhaps constantly throughout daylight hours). It is intended to detect the presence of leakage current, a frequent predecessor to ground faults. However, it may also detect ground faults, and indeed any current loss from shorts and arcs, as but two examples.

As used herein, a string includes a serial connection of module assemblies, and is connected between two rails (typically a lower potential rail and a higher potential rail); rails serve as common connection sites for the two string ends (in addition to delivering power to inverters and/or other components). It is of note that a string may include components, perhaps such as a converter(s), that at times may not be technically connected strictly in series with module assemblies (see, e.g., certain FIGS. 2-10 of PCT patent application publication WO2011/049985). Nonetheless, such components are all deemed part of a string.

It is also of note that a single string connected module assembly always includes a module, and is the entirety of the components that are serially strung together. As such, in some circuits the serially connected solar module assemblies include converters (e.g., where each module has a converter connected thereto). In other circuits (e.g., most conventional PV circuits), the serially connected solar module assemblies do not include converters. Note that the entirety of that which is serially connected and includes a module is the serially connected solar module assembly. Again, because this inventive detection technology can be used on a wide variety of circuits (both conventional and currently undeveloped), the serially connected components of strings may be only modules, and the serially connected components of strings in other circuits may be modules with converters connected directly thereto (e.g., one converter per module). In those circuits where each module has a converter connected directly thereto, while it may appear that only the converters themselves (and not the modules) are the serially connected, instead, a more proper understanding views the entire module assembly (i.e, the module and the converter, and wired connections therebetween), as being serially connected. Indeed, such a serially connected module assembly includes the module, the converter, connections therebetween, resistors and other components within the converter, and connections between the converter (or module) to other converters (or modules).

In embodiments where current is measured at two different points, and a difference between them is determined in order to assess the presence of leakage current, it is important that the measurements used to determine each particular one of the instantaneous measured current differences be sufficiently simultaneous; indeed, such enables reliable conclusions. This requirement is due to the quickly changing nature of insolation on the panels. While perfect synchronicity is not required, in order not to compromise the invention's detection capability nor the reliability of results, the terms instantaneous, synchronous, at the same time, etc., preferably imply within 200 ms. However, such terms may imply occurrence at times that are even closer in (e.g., within 150 ms, within 100 ms, within 50 ms, within 20 ms, within 10 ms, within 5 ms, and within 2 ms, as but a few possible ranges). Times are considered different if they are out of such ranges. It is of tangential note that all measurements of any parameter, including current measurements, are made over a period of time, even where a genuinely instantaneous measurement is desired. Indeed, typical measurement protocol involves the integration of a measured value over time (perhaps only milliseconds), and then a subsequent determination of an average value of the measured parameter during that time. Given this, a technical explanation of the term instantaneous as it applies to the case where two different synchronized (i.e., "simultaneous") measurements are made and used to determine a measured instantaneous difference (e.g., a measured, instantaneous intra-string current difference), would clarify that in fact, it is the start and stop times, respectively, of a first current measurement (that is used, in conjunction with a second current measurement, to determine a measured, instantaneous current difference) that must be within the start and stop times of the second measurement, if indeed such measurements are to be used to determine an instantaneous difference. Again, the allowable time difference is within 200 ms, within 150 ms, within 100 ms, within 50 ms, within 20 ms, within 10 ms, within 5 ms, and within 2 ms, as but a few possible ranges. It is of note that differential current measurers inherently generate an instantaneous current difference, and thus are another way of determining a measured, instantaneous intra-string current difference.

It is also of note, relative to assuring reliability of results, that measuring equipment should be of sufficient high precision. Preferably, it is at least within 1% accuracy, but also may be less than or equal to about 0.5% error, or 0.1% error, or 0.05% error, or 0.01% error). Further, any of a variety of equipment can be used to measure current (voltmeter across a resistor of known value, ammeter, differential current measurer, etc.) may be used to provide sufficiently precise measurement capability.

In particular embodiments, at least two measured, instantaneous intra-string current differences may be determined for at least one of the power generating string(s), each of such differences associated with a different respective two points on the power generating string. Such differences may each be associated with a different serially connected module assembly. For example, a respective two points for a first difference may be negative converter outputs for two neighboring solar module assemblies (that each have converters). The difference would be associated with the lower voltage serially connected module assembly (i.e., the one closer to the lower potential rail). It could be used not only to detect leakage from such solar module assembly, but, perhaps more generally, from any location or site between the respective two points. The difference in instantaneous current that would apply to the higher voltage serially connected module assembly of the two "neighbors" (i.e., the one closer to the higher voltage rail) would be associated with a different set of points, although indeed one of such two points may be the same (i.e., "shared"). As an example, the negative output current for the higher voltage solar module assembly may serve not only as one of the measurements (or one of the points of measurement) for the lower voltage solar module assembly, but as one of the measurements used in the determination of any current difference relative to the higher voltage module assembly (see, e.g., FIG. 3, where the ends of the circular arcs indicate points/parameters of measurement involved in the determination of a single measured, instantaneous intra-string current difference). It is of note that output does not necessarily indicate current flow direction, as indeed, current that is output from a converter can flow into that converter (see in particular the flow direction of wire commonly known as the negative converter output for converter of serially connected module assemblies). The term output is used because the input refers to the connect from the module (the core power supply) to the converter.

Figure 6:
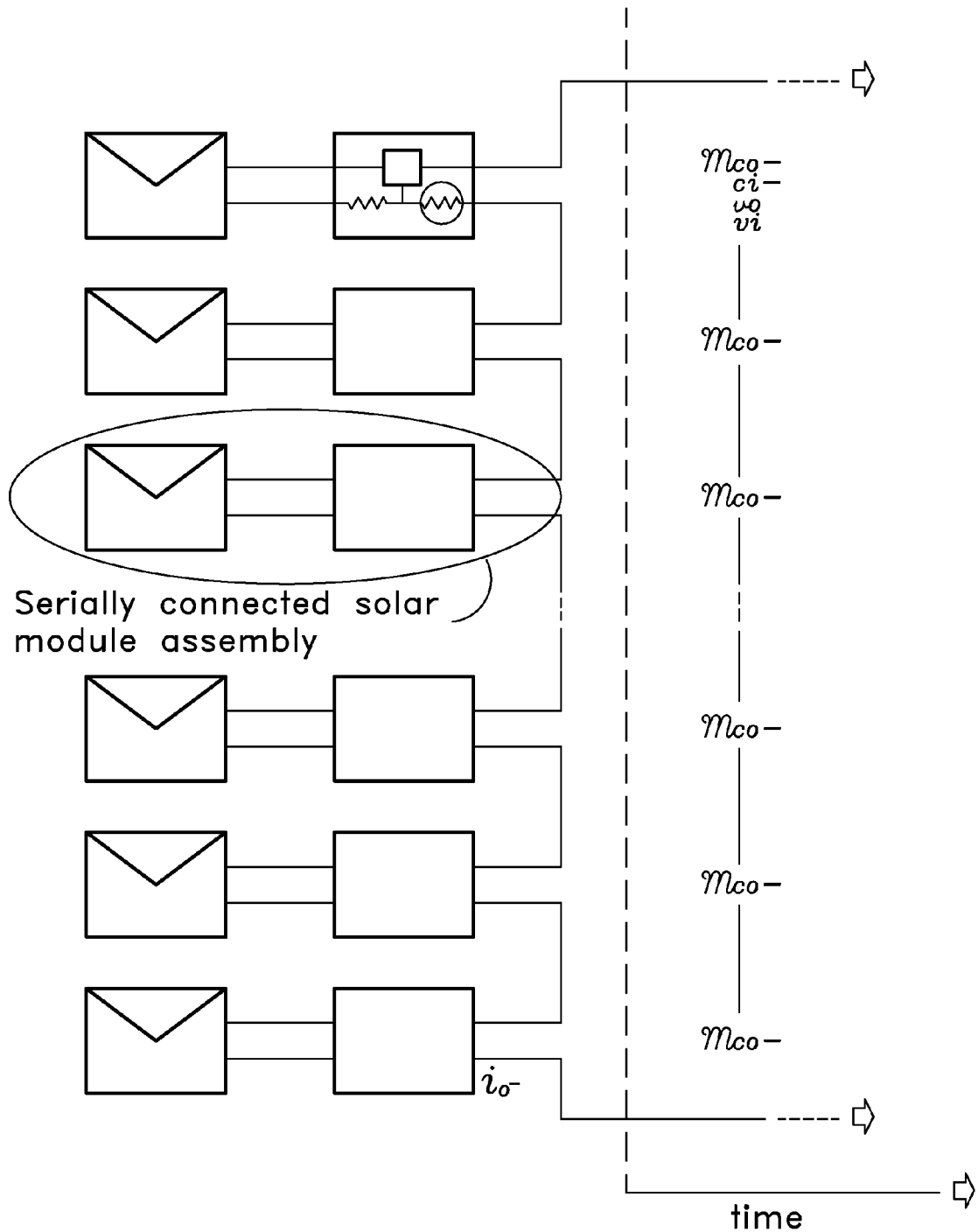
FIG. 6 shows how in one embodiment of the inventive detection method all measurements are taken synchronously.
Figure 7:
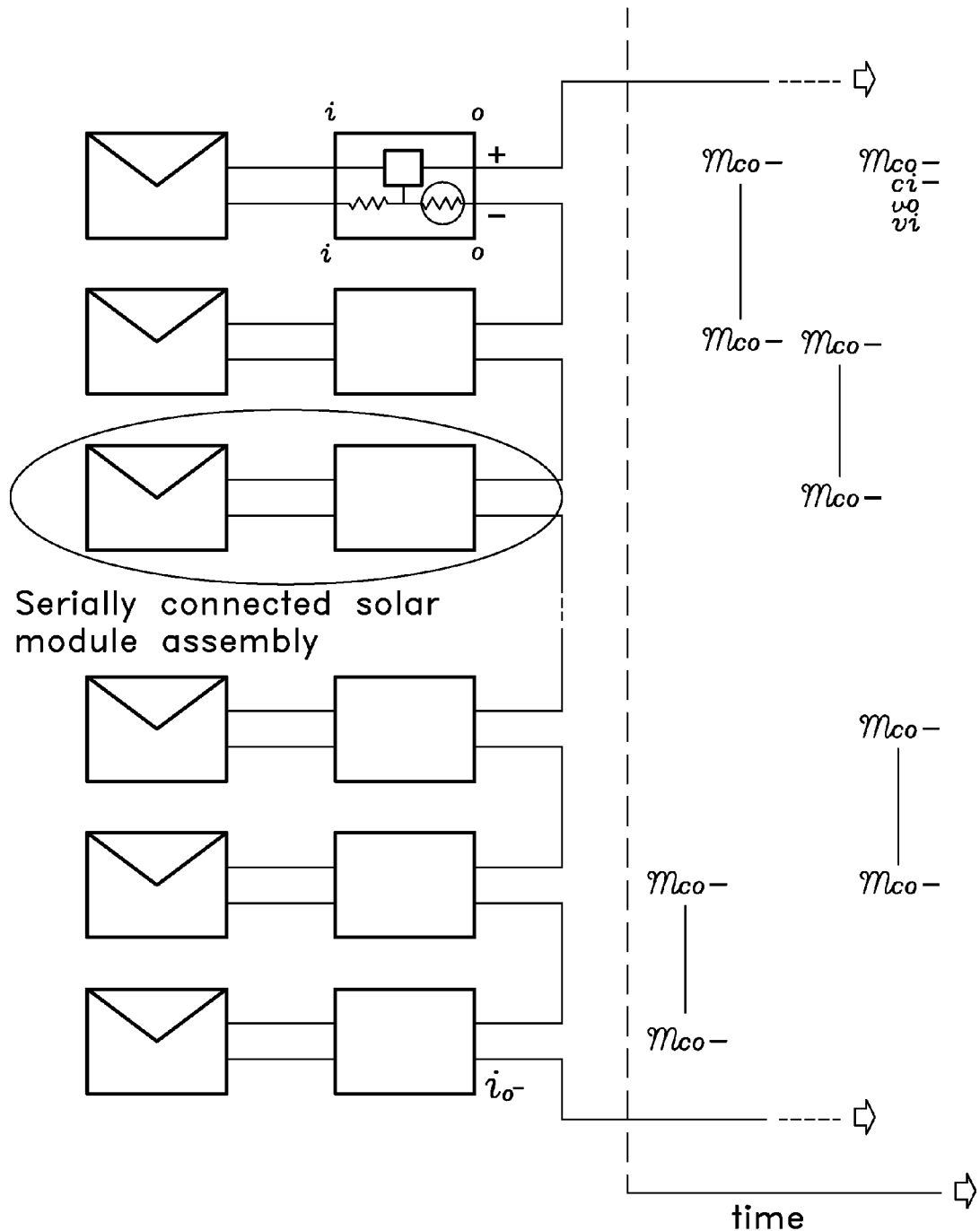
FIG. 7 shows an alternate embodiment of the inventive detection method where at least some of the measurements are taken at different times.
Figure 8:
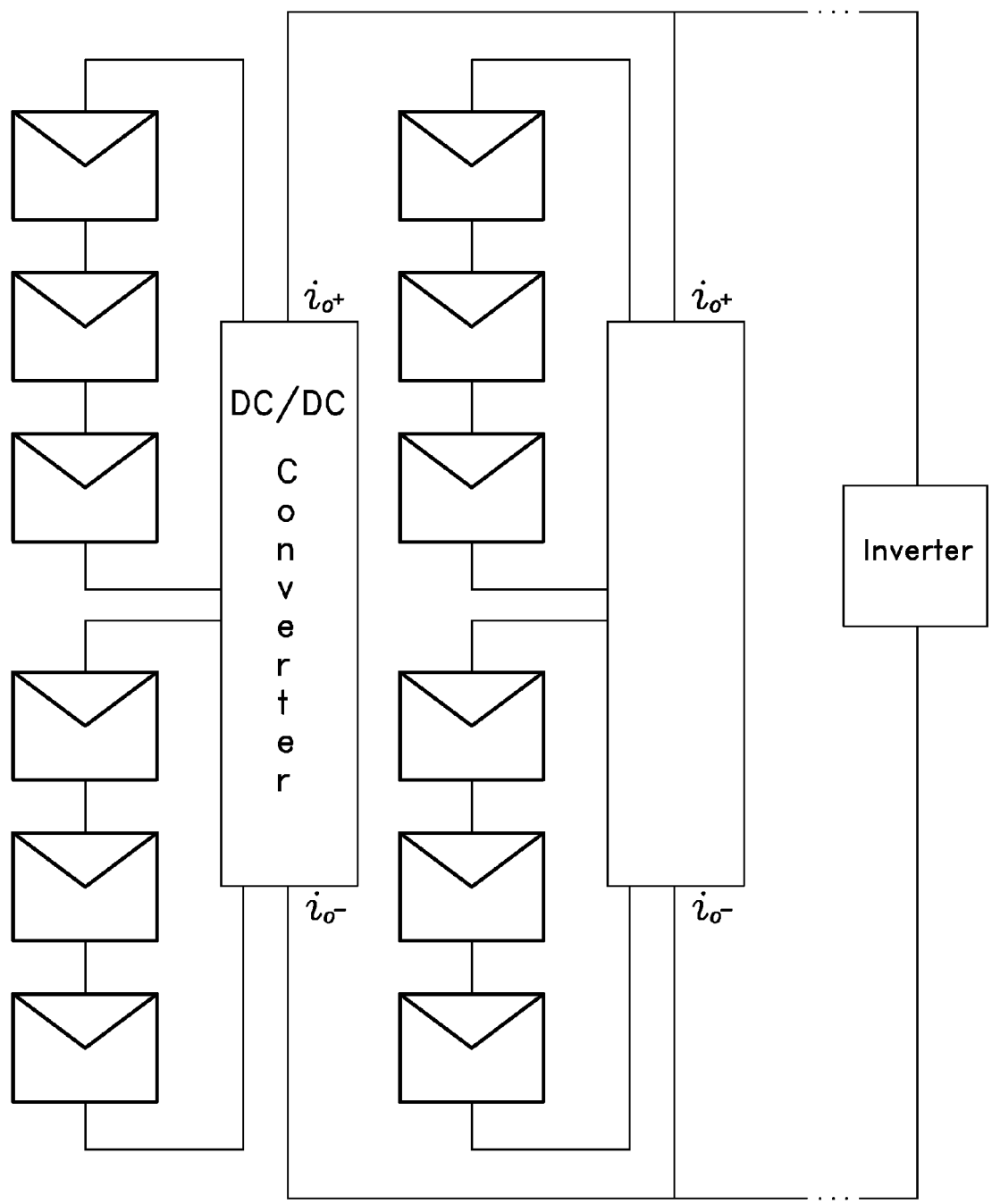
FIG. 8 shows one type of solar array that may benefit from the inventive detection technology. Each string of FIG. 8 has a converter situated to create two substrings within each string.
Figure 9:
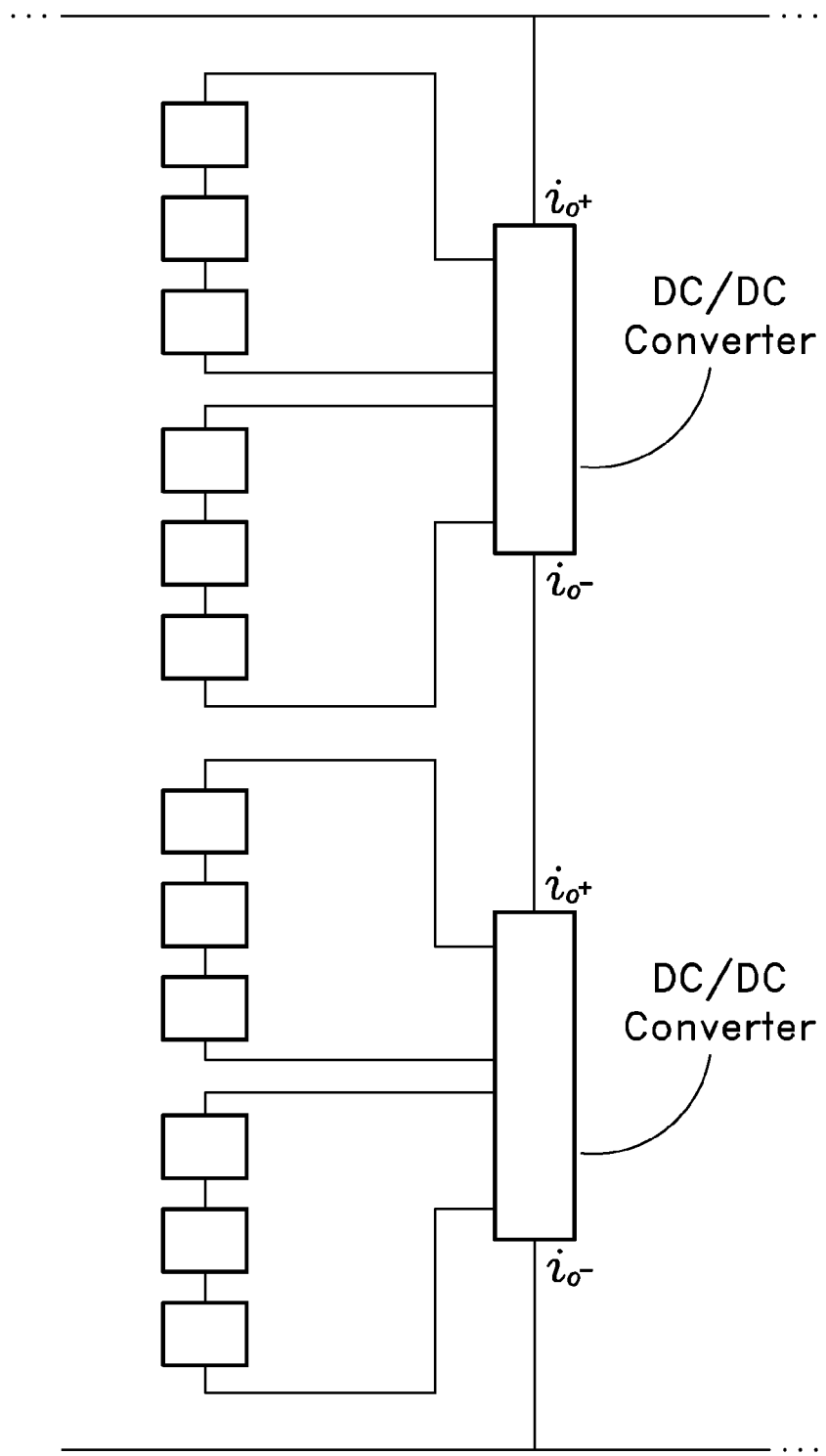
FIG. 9 shows topology that presents serially connected converters in each string; each converter itself may receive input from one or more substring, as shown. As with FIG. 8, converter input current measurements may afford a higher degree of leak location resolution than afforded by converter output current measurements. It is of note that a variant of this general topology may include only one converter per string (i.e., the variant circuit would include no serial connection of converters).

In order to be able to limit complexity, inter alia, all of the current measurements used to determine all of the at least two measured, instantaneous intra-string current differences may be taken at the same time (see, e.g., FIG. 6, where "m" indicates measurement(s) used to determine an instantaneous difference, "c" converter, "o" output, and "−" negative). However, such "comprehensive" synchronicity is not required (see FIG. 7 for a possible way in which different sets of measurements (each set of two synchronously taken measurements used to determine a measured, instantaneous intra-string current difference) may be taken at different times). However, as explained above, where two measurements are used to determine an instantaneous difference, such measurements must be taken sufficiently simultaneously (i.e., within one of particular ranges indicated above).

Points on the string that can be measured include any points that, under ideal, non-leakage, non-arc and non-fault operation, will have the same current as the wire that serially connects the serially connected module assemblies, or, particularly relative to a converter-including module assembly that is closest to the higher rail, any points that, if measured, can be used in calculations to determine actual string current (see explanation as to the peculiar problem posed relative to the converter-including module that is nearest the higher potential rail). As such, an instantaneous difference will be zero (note that when one has determined that two synchronously measured currents are sufficiently the same, they have determined that the difference is substantially zero) under normal operation. It is also of note that at times, in applications where strings include converter(s), it may be desired or even necessary to measure converter output current(s) and/or converter input current(s). However, when sufficient to achieve the intended goal, preferably the measured current is an output current, and preferably the lower potential current (e.g., when measuring current output or input from a converter, it is preferred to measure the negative (instead of the positive output), if only for measuring equipment cost reasons). It is of note that where a current output measurement is made for each serially connected module assembly, and each has a converter therein, an ideal location to measure the negative converter output may be across a resistor within the converter near the output terminal.

It is of note that a differential current measurer is one manner in which an instantaneous current difference between two respective points may be determined, and that differential current measurers of adequate quality will inherently determine measured, instantaneous intra-string current differences. Use of such equipment may involve connecting the differential current measurer across the respective two points. A differential current measurer may automatically output some indication of the measured current difference. Note that several of the various "m's" of FIGS. 6 and 7 may also be associated with points of hook up for a differential current measurer.

Another manner of determining an instantaneous current difference includes the step of using a first current measurer at a first of the respective two points of the power generating string and a second current measurer at a second of the respective two points; synchronously measuring current at the first and second points to determine a first point current measurement and a second point current measurement; and determining a difference between the first point current measurement and the second point measurement. As mentioned such two measurement should be synchronous due to the quickly changing nature of insolation on the array. It is of further note that the step of determining a difference can be performed even where there is simply a comparison and inspection as to whether there is a difference at all, or whether the two values are sufficiently equal or not. It typically involves a simple calculation (subtraction).

Relatedly, the step of assessing may include comparing an instantaneous current difference value to determine whether that value is significant enough to suggest the presence of operational abnormality (e.g., leakage current, or perhaps even ground fault). It may, but need not, involve subtracting a certain standard value (which may be chosen as reflecting, e.g. noise/imprecision inherent in the measurers) from the determined instantaneous current difference and determining whether such result is large enough to suggest that the determined instantaneous current difference is indeed significant, and suggests an actual leakage (or other) current. As such, depending on the system, some measured instantaneous differences might be small enough not to raise a concern. When a difference in current (sufficiently non-zero, and not within a non-zero range of no concern) is detected, then a conclusion can be made that there is an operational abnormality occurring at some point(s) between the two points of measurement. Of course, the higher resolution the detection system (e.g., a system that determines current differences across every single serially connected module assembly is a high resolution system), the less power generation needs to be isolated from the rest of the array or shut down during repair.

In certain applications, it may be sufficient to determine only one measured, instantaneous intra-string current difference for at least one of the at least one power generating string. Such would not enable location of the particular solar module assembly that is faulty if a leak in the string is detected, but such high location resolution might not be necessary for a particular application. Such detection schematic be applied to a variety of different types of strings, including but not limited to those with converters, those without any converters therein, those with substrings, and those without substrings. For example, in the case of strings without any converters, one may determine a measured, instantaneous intra-string current difference between a current from a module nearest a lower potential rail to that lower potential rail, and a current from a module nearest a higher potential rail to that higher potential rail. In the case of a single converter, no substring type string, one may enable detection of a current from the string by determining a difference between converter output currents. In the case of a single converter, double substring type string, a determination of a difference between converter output currents may enable a determination that one or both of the two substrings are faulty; a determination of a difference between converter input currents may enable a determination of which particular substring is leaking current.

Often, a high leakage location resolution, such as that afforded upon determining a plurality of measured, instantaneous intra-string current differences for the power generating string(s), is desired. If the string comprises "n" number of the serially connected solar module assemblies, determining "n" number of measured, instantaneous intra-string current differences for the string should allow for precise location of the current leaking module assembly (or generally, the abnormally operating module assembly). In the case where each of the module assemblies includes a converter, a majority (i.e., more than half, including all) of the measured, instantaneous intra-string current differences of the at least one of the at least one power generation string may be a difference between measured output currents (e.g., negative output currents, or instead, positive output currents) of a respective two neighboring converters; note that the term "majority" is used because of the peculiarity posed by the module assembly nearest the higher potential rail and by the module nearest the lower potential rail. In the case where the majority of the differences are determined from measured negative converter output currents, the measured, instantaneous intra-string current difference for the serially connected solar module assembly nearest a higher potential rail may be determined (via calculation in this case) from measurements of negative converter input current, negative converter output current, converter input voltage, and converter output voltage of that module assembly's converter. More particularly, the positive converter output current can be calculated from the converter input voltage, the converter output voltage, negative converter input current and negative converter output current, and such calculated positive converter output current can be subtracted from the measured negative converter output current to determine whether there is any leakage through the module. In the case where positive converter output currents are measured to determine a majority of the instantaneous current differences (see FIG. 3), the reverse applies—the lower potential module assembly now poses a problem, and measurements of positive converter current input and positive converter current output, in addition to converter voltage input and output can be used to calculate the negative converter output current of this lower potential module assembly; such value can be subtracted from the measured positive converter output current to determine whether such module assembly is leaking current.

In the case where the string has no converter, and it is desired to be able to particularly locate which module assembly is leaking current, one may determine "n" number of measured, instantaneous intra-string current differences for the string, where each current difference is across a different module. It is of note that one may also determine a plurality, but fewer than "n" (where "n" is the number of serially connected solar module assemblies), instantaneous current differences. Such may enable, for example, location of the leakage on a "more than one module assembly, but fewer than all" level. As is typical, such instantaneous differences need not all be measured at the same single point in time.

In certain of such designs, each converter may receive power from more than one substring; in other designs, each converter may receive power from only one substring. As to the former designs, in order to locate precisely which substring is operating abnormally (e.g., due to current leaking therefrom), it is necessary to determine whether there is a difference between input currents (positive and negative) to the converter. However, it may be sufficient for a certain application (and certainly less complex) to determine whether there is a difference only between output currents (positive and negative), thereby enabling a determination as to whether one or more of the substrings connected to the converter are operating abnormally (without enabling a precise location of which substring is operating abnormally).

In designs where each converter receives power from only one substring, there may be no need to compare converter input currents to determine which substring is operating abnormally (e.g., which substring is leaking current, or has a ground fault or arc) because a determination that the converter output currents are different will allow only one possibility—the one substring inputting to that converter is the leaking, faulted, or arcing substring. While faulty substring identification alone does not identify which module(s) within the substring are faulty, at least only the faulty substring needs to be shutdown (instead of the entire string). If desired, additional on-site diagnostics can be performed on the isolated substring to determine which particular module assembly (ies) are faulty.

Figure 10:
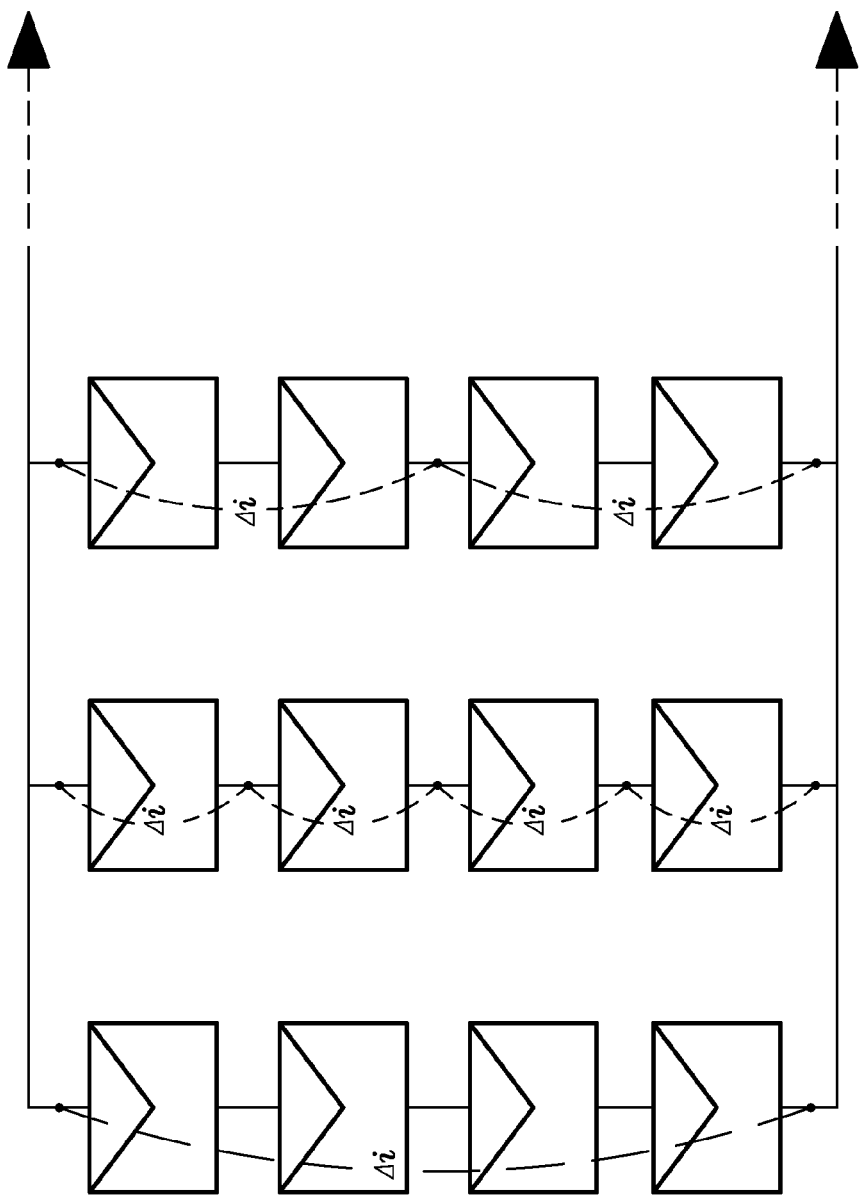
FIG. 10 shows three different possible levels of leakage location resolution.

In one type of single converter per string arrangement, however, the converter may be arranged such that it does not "split" the converters of a string into a substring arrangement (see, for example, FIG. 10 of WO 2011/049985). In order to determine whether such string is operating abnormally (e.g., due to leakage current), it is necessary only to determine whether there is a difference between the two converter output currents (positive and negative).

In circuits whose strings have no converters therein, such that the strings present as serial connections of modules only, if it is desired to determine which particular module is operating abnormally (e.g., leaking current), a detection system that determines instantaneous current differences between points on either side of each module would suffice (such that there would be a total of n+1 points at which either current would be measured, or to which n number of differential current measurers would be hooked up to, where n is the number of modules in the string). If less diagnostic precision is desired, then fewer current measurers or differential current measurers would be established as desired (perhaps it is sufficient to only determine the difference between the current of the wire between the serially connected module nearest the lower potential rail and the lower potential rail, and the current of the wire between the serially connected module nearest the higher potential rail and the higher potential rail. Such would only provide detection information that were no more precise than whether that string was operating abnormally, but this may be sufficient at times. Regardless of the precision of the detection system, each serially connected module assembly (and preferably all connections therebetween) would ideally be within two respective points whose current difference is determined. As such, if any part of the string, including the serially connected module assemblies, is losing any amount of current (for whatever reason), then the diagnostic system will detect this loss. It is of note that any of the diagnostic systems applicable to strings with serially connected modules (i.e., where the serially connected solar module assembly does not include a converter), are also applicable to substrings, perhaps in addition to or instead of those systems that measure converter currents. Often, as such systems may involve a costly, and unnecessary, redundancy, it may be preferable to use only a substring current measurement based system or a converter current measurement based system.

In those systems with serially connected module assemblies that each include a converter, one approach to assess the presence of any current leakage from each of the assemblies involves the determination of differences between converter output currents of neighboring module assemblies. However, as indicated above such approach presents a problem relative to the module assembly closest to the higher potential rail (if taking negative converter output measurements to determine instantaneous differences), and relative to the module assembly closest to the lower potential rail (if taking positive converter output measurements to determine instantaneous differences)—there is no converter of that string that neighbors it towards this higher/lower potential rail. As such, determining differences of converter outputs of neighboring module assemblies will not work to as a means to assess whether the module assembly nearest the higher potential rail is leaking or draining current. Instead, calculations as explained elsewhere herein may be used to determine whether there is any leakage from such "rail proximate" module assembly. It is of note that even where such calculations are used to determine an instantaneous difference (of course, such measurements must be made synchronously), that calculated difference in current is considered to be between a respective two points.

The inventive detection technology (indeed, any aspect of the inventive technology disclosed herein) may apply to various string arrangements, including but not limited to arrays having strings without converters therein, and arrays having strings with at least one converter therein. As to the latter type (see, for example, FIGS. 2-10 of PCT patent application publication WO2011/049985, incorporated herein in its entirety), there may be one converter per each module of the string (as mentioned, the module and converter, as combined, is a type of serially connected solar module arrangement), or there may be fewer than one converter per each module. As mentioned, when there are fewer than one converter per module, the string may present as two or more substrings that input power to the converter(s).

It is of note that once a positive assessment as to the presence of a current leak is made, an automatic computerized response of some sort, such as isolating or bypassing the faulty string, substring, module assembly, or group of module assemblies, relative to the rest of the array, may take place. Perhaps it may only be necessary to current limit such faulty portion of the array (perhaps for a short time). An isolating computerized response (triggered by an unacceptably high instantaneous current difference value), may allow for prompt repair without requiring shutdown of the entire array and may preclude circuit damage.

Of course, certain embodiments of the inventive technology may involve significant amounts of data, and a concomitant need to arrange, coordinate, manipulate, organize, track, record and/or store it all—generally handle it. As such, one step of the inventive apparatus may be handling data generated upon performance of the step of determining at least one measured, instantaneous intra-string current difference for each string. One manner in which this may be accomplished is via computerized algorithms/software (generally computerized componentry) disclosed in U.S. Provisional Application Ser. No. 61/536,440 (which is incorporated herein in its entirety, as are all patent applications or publications referenced herein)

An inventive apparatus of the general current measurement detection technology may be described as a solar power circuit operable to detect operational abnormality, the circuit comprising: a solar power array that comprises at least one power generating string, the at least one power generating string comprising a plurality of serially connected solar module assemblies; at least one measured, instantaneous intra-string current difference determinator for each of the power generating string, each determinator determining an instantaneous difference in string current between a respective two points on the at least one power generating string; operational abnormality assessment componentry that acts on data generated by the at least one measured, instantaneous intra-string current difference determinator; and computerized detected leakage response componentry that is responsive to the assessment componentry. Indeed, a positive assessment as to the presence of leakage current may cause the response componentry to act (e.g., by isolating a faulty module assembly). Any of the determinator, operational abnormality assessment componentry and the computerized detected leakage response componentry may be computerized, and controlled (or have their associated data controlled) via software, hardware logic circuits and/or computer algorithms.

The measured, instantaneous intra-string current difference determinator may be a differential current measurer across the respective two points and/or may include two current measurers, one at a first of the respective two points and another at a second of the respective two points. Particularly in the latter case, it may include computerized componentry that compares a current measurement at the first point with a current measurement at the second point. Particularly in embodiments where the serially connected solar module assemblies of the string each include a converter, the apparatus may further comprise measurement componentry configured to measure converter input current, converter output current, converter input voltage and converter output voltage of a converter of a serially connected module assembly that is nearest a higher potential rail or a lower potential rail (as explained elsewhere herein) of the at least one solar power generating string of the solar panel array.

The operational abnormality assessment componentry may be any componentry that inspects measured, instantaneous intra-string current difference data and determines whether or not any difference is significant enough to suggest some sort of current leakage. As data generated may be significant, the apparatus may further include computerized data handling componentry configured to handle data generated by the at least one measured, instantaneous intra-string current difference determinator. Such may be as disclosed in U.S. Provisional Application Ser. No. 61/536,440.

Another source of protection perhaps afforded by the response componentry is the isolation of the ground fault or leakage string or module from the rest of the system. If the DC/DC converter, which may include response componentry, were also to have current limiting capabilities it could give the PV system the ability to continue operating when there is a ground fault condition by limiting the current produced by the faulted string, and thereby prevent the fuse in the inverter from being blown. Another aspect of this invention could include the ability of the DC/DC converter to detect the ground fault condition and turn the modules in the afflicted string "off" by disconnected their outputs, and perhaps isolate the string from the rest of the system. Being able to isolate the string might make it possible for the system to continue to run without the danger caused by the ground faulted string.

Rail Grounding/Field Reversal Leakage Detection Invention:

There is also an advantage provided by high resolution current measurement to locate at a module assembly level where ground faults could potentially occur. Major locations for ground faults may include midstring locations, top and bottom rails, and the conduit that carries the power to the inverter, etc. Circuit architecture as disclosed herein, potentially coupled with DC/DC converter technology including but not limited to that of the incorporated references, could provide the resolution necessary to detect ground faults throughout these and other locations, making it now possible to detect, locate, and isolate potential ground faults before they can do damage. Two potential architectural additions that seek protecting and perhaps providing this additional resolution needed can involve additions to the main power line to the inverter (inverter level architecture), and/or an addition to each string (string level architecture) (see generally, FIGS. 11-15). Of course, the circuitry generally appearing in FIGS. 11-15 could be located physically anywhere, including in or as part of the inverter circuitry (in such case, the left side of the circuit as shown in the figures would still be the module side). This should be considered purely as an illustrative idea for achieving the intended results. It is obvious to one skilled in the art, upon his/her being presented with the inventive technology disclosed herein, that there are many circuit and/or functional equivalents, as well as other embodiments possible based on these general concepts.

To understand the safety aspects of the present invention, it should be mentioned that the Target® fire in 2009 may have been the result of two ground fault issues; one in the conduit running to the inverter, and one in the string that was destroyed in the fire. The combination of these above-mentioned architectural changes would provide a type of visibility, that when coupled with routine daily automated maintenance, could predict and enable prevention of ground faults before they become a severe issue.

FIGS. 11-15 generally illustrate examples of architecture that can detect a ground fault possibility (e.g., leakage current) in the conduit running from module side componentry (e.g., a PV array, a string, or a combiner box) to inverter side componentry (e.g., a combiner box or inverter), whether such conduit be a rail(s) or otherwise. In a conventional PV array, pinched wires or unexpected narrow spacing may not arc over unless a substantial voltage change occurs. In the Target® fire example the short to ground of the upper rail may have caused a voltage reversal on the entire array which consequentially may have put an extraordinarily large voltage across a gap which was unexpectedly narrow, thereby causing an arc condition.

Particular embodiments of the inventive rail grounding technology can be used to achieve detection and safety hazard purposes. For instance, when the rail voltages and/or any point in the array is taken to the highest voltage potential it may experience during a fault of this type, circuit response can indicate adequate spacing or immunity to such faults (or the absence thereof). The sequence of steps below is merely one example of how an embodiment in a system may artificially reverse the voltage on an array and simulate this type of fault. It can even do so in a routine way which is safe and may anticipate the conditions which otherwise could contribute to a fire. Furthermore, through communication or the like, the inverter level detection architecture (see, e.g. FIG. 12) can be combined with the DC/DC converters and can go through a routine that could check for faults in the lines. Possible steps for those strings with one converter per module can be outlined as follows:

1. DC/DC converters can be used to turn off modules in an array.
2. Detection architecture (with disconnect switch componentry) can disconnect the array from the inverter.
3. Top rail can be connected to ground (perhaps via rail ground switch componentry) and through a current limiting resistor (see, e.g., FIG. 12).
4. DC/DC converters can turn the modules in the array on.
5. System can be checked for faults.
6. DC/DC converters can turn the modules in the array off.
7. Bottom rail can be connected to ground via rail ground switch componentry, and through a current limiting resistor (see, e.g., detection architecture generally of FIG. 12).
8. DC/DC converters can turn the modules in the array on.
9. System can be checked for faults (perhaps using current measuring equipment).
10. DC/DC converters can turn the modules in the array off.
11. Both rails can be disconnected from ground perhaps via detection architecture.
12. Detection architecture can connect the array to the inverter.
13. DC/DC converters can turn the modules back on.

As should be appreciated, a similar method can be applied to bi-polar arrays where one polar side of the array may remain "off" via the DC/DC converters, or may be disconnected via a different detection architecture, while the other side of the array goes through a system check. Another method may include attaching the rails of the bi-polar array together, and applying a voltage via an external power supply to achieve a field reversal, and then going through a similar, or variation of the system check described.

Figure 11:
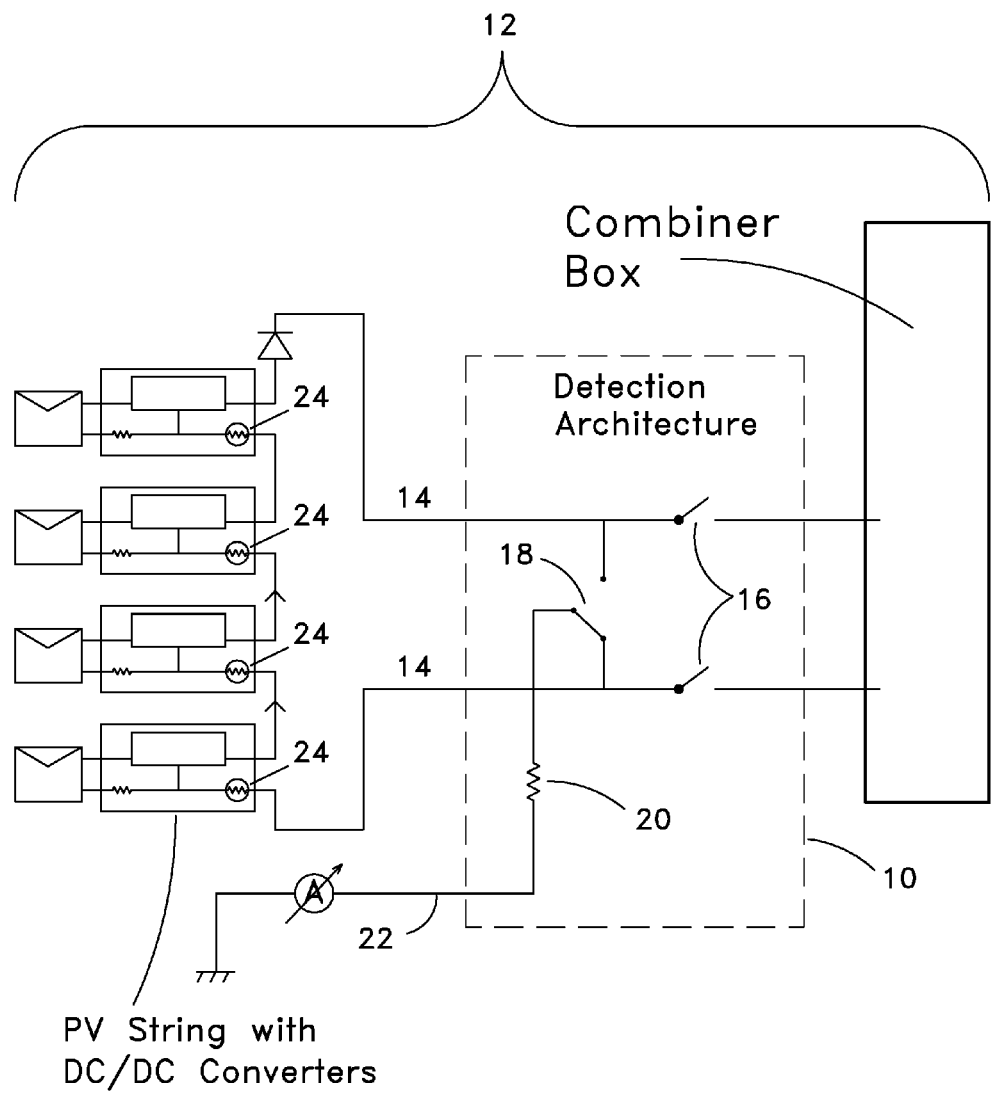
FIG. 11 shows string level detection architecture as may be found in one embodiment of the inventive detection technology.

For even higher resolution, perhaps useful to locate where the ground fault locations are, including should they be in the rails, embodiments may provide a string level architecture perhaps such as illustrated in FIG. 11. This example is also illustrative of how this concept may be expanded. A person skilled in the art may also easily see how there are many ways to reverse the voltage on an array. It may be that for some embodiments the voltages do not need to be reversed but merely altered. The array may be bipolar but there may be various techniques to simulate the consequences of an unwanted fault causing voltage changes on an array. Upon being presented with the description of the inventive technology disclosed herein, such techniques would be obvious to one of ordinary skill in the art. Some of these techniques should benefit from having module level control and ability to switch the power conversion circuitry off.

Interestingly, in the Target® example, it was necessary to bring in a third party to disconnect several strings to stop power flow to the damaged areas once the ground fault occurred. This process took time, and it is likely that more unnecessary damage occurred during this process. With the appropriate arrangements of the inventive technologies described herein, it may be possible with a communication system in place or otherwise, to turn off the power in the entire system rapidly, preventing further damage once a ground fault has occurred.

Referring again to FIG. 11, it can be seen that certain string level detection architecture could be used to pinpoint exactly which string has the ground fault without interrupting the inverter, while also providing another level of protection. Should a ground fault be located in the strings, either mid-string or on the rails, the detection architecture could be configured to physically disconnect from the inverter and isolate the string until further maintenance is performed. Much like in the inverter level, a routine daily maintenance could also be performed to check for ground faults on the strings, combined with the DC/DC converters, perhaps through communication. Possible steps for such an embodiment can be outlined as follows:

1. DC/DC converters can be used to turn off modules in array.
2. Detection architecture (disconnect switch componentry) can disconnect the string from the inverter.
3. Top rail can be connected to ground (perhaps through via rail ground switch componentry) through a current limiting resistor.
4. DC/DC converters can turn the modules in the array on.
5. System can be checked for faults (using one or more current measurers).
6. DC/DC converters can turn the modules in the array off.
7. Bottom rail can be connected to ground through a current limiting resistor perhaps via detection architecture.
8. DC/DC converters can turn the modules in the array on.
9. System can be checked for faults.
10. DC/DC converters can turn the modules in the array off.
11. Both rails can be disconnected from ground perhaps via detection architecture.
12. Detection architecture can connect the string to the inverter.
13. DC/DC converters can turn the modules back on.

Figure 12:
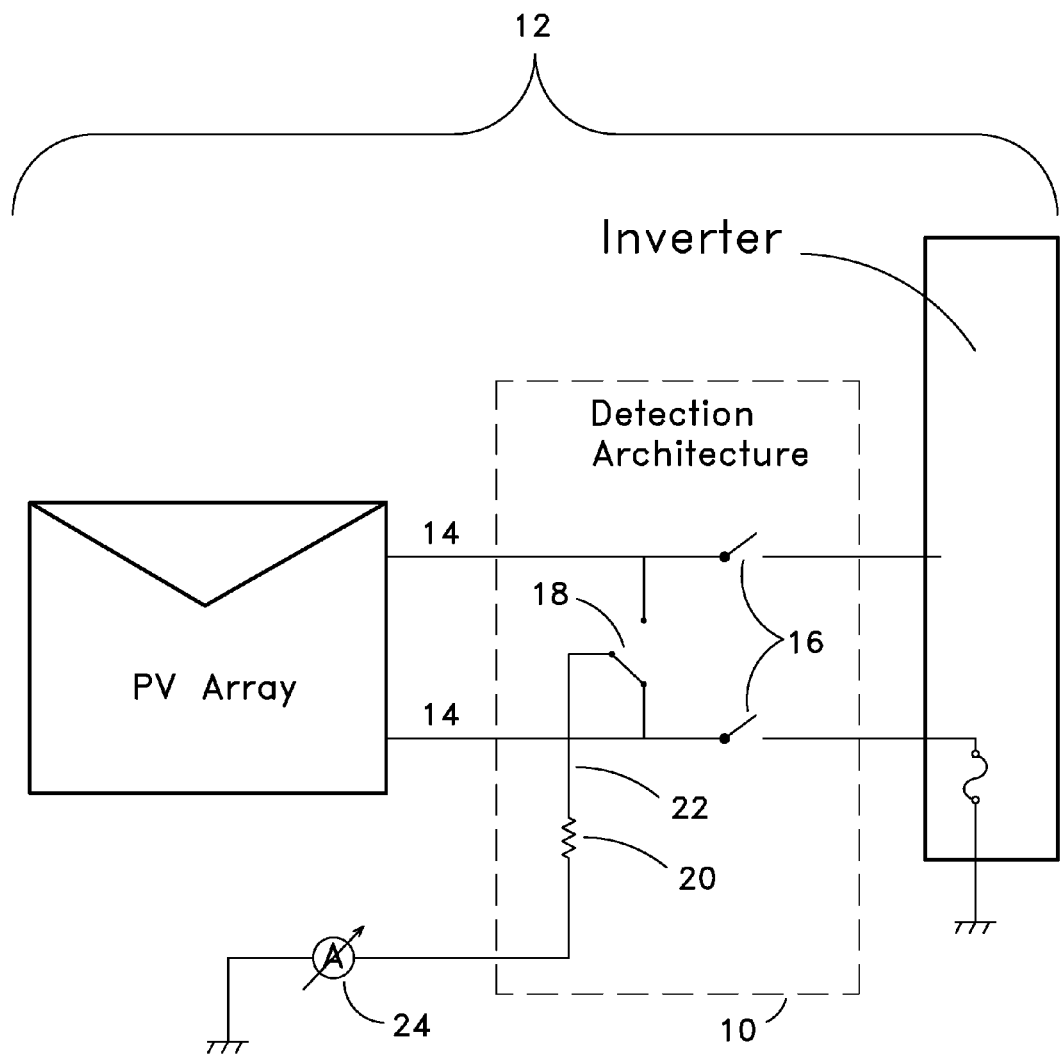
FIG. 12 shows the detection architecture of FIG. 11 applied at the inverter level.
Figure 13:
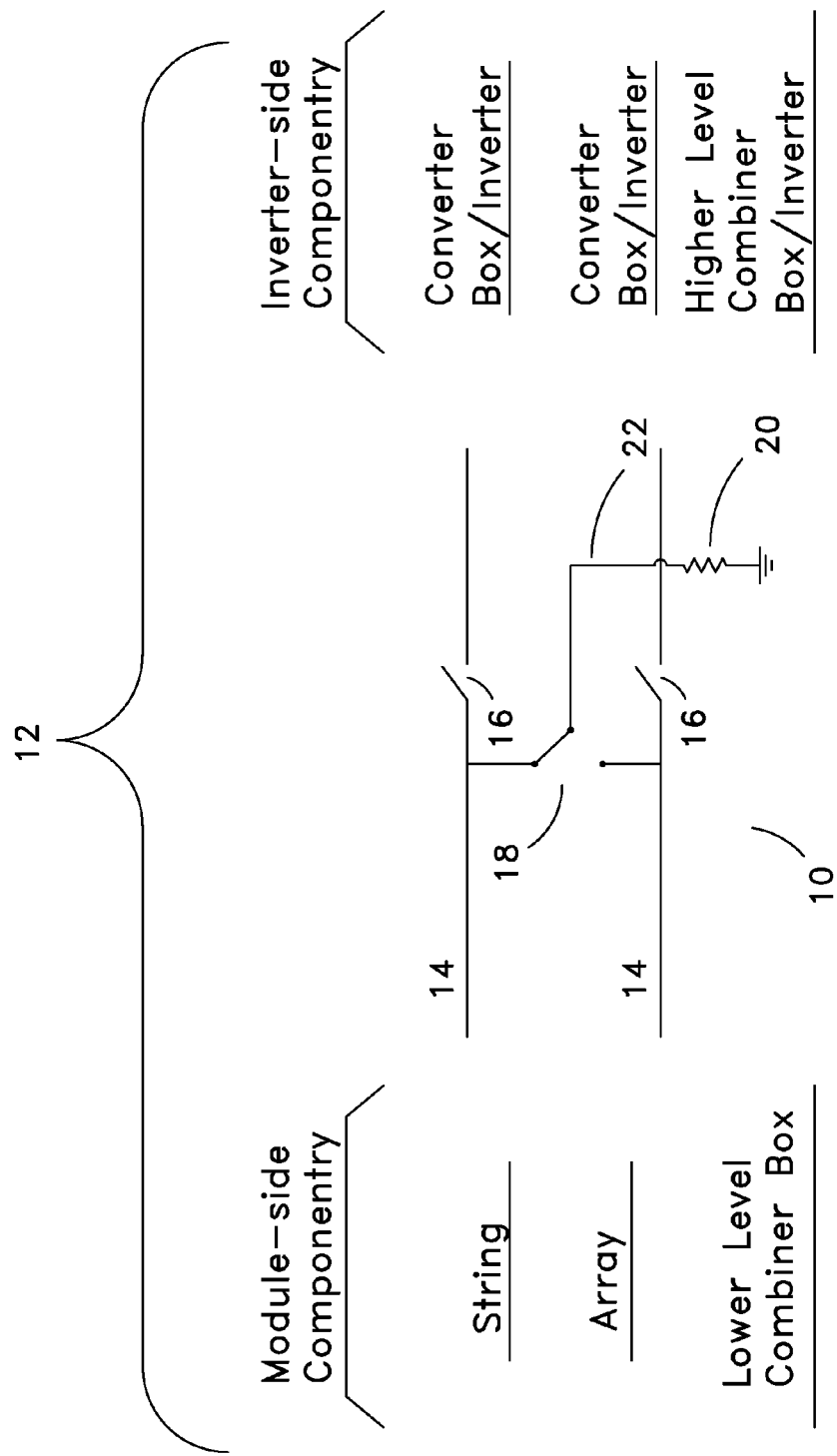
FIG. 13 shows module side componentry and inventor side componentry as may be found relative to an embodiment of one aspect of the inventive detection technology.
Figure 14:
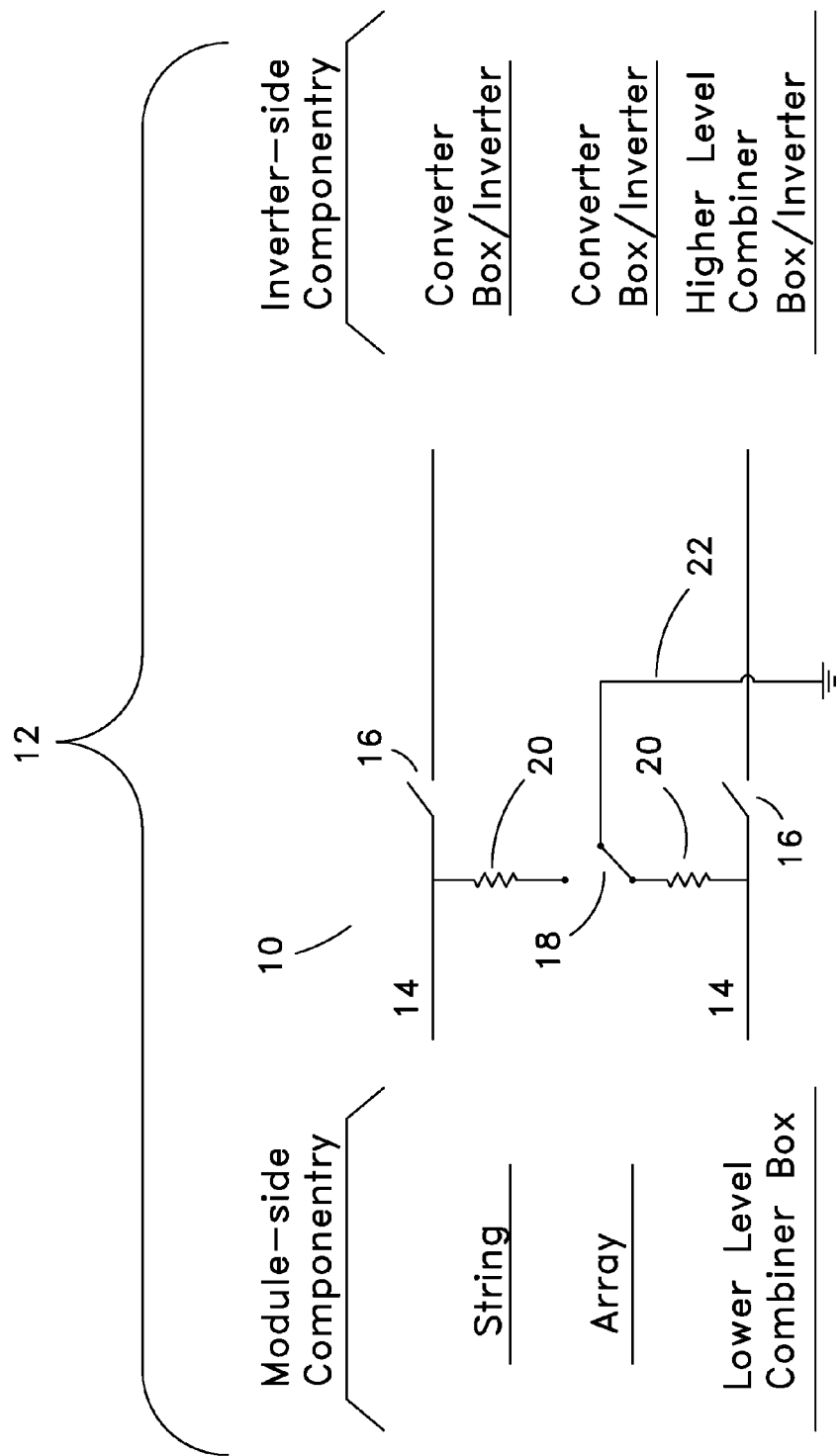
FIG. 14 shows module side componentry and inverter side componentry as may be found relative to a different aspect of the inventive technology.
Figure 15:
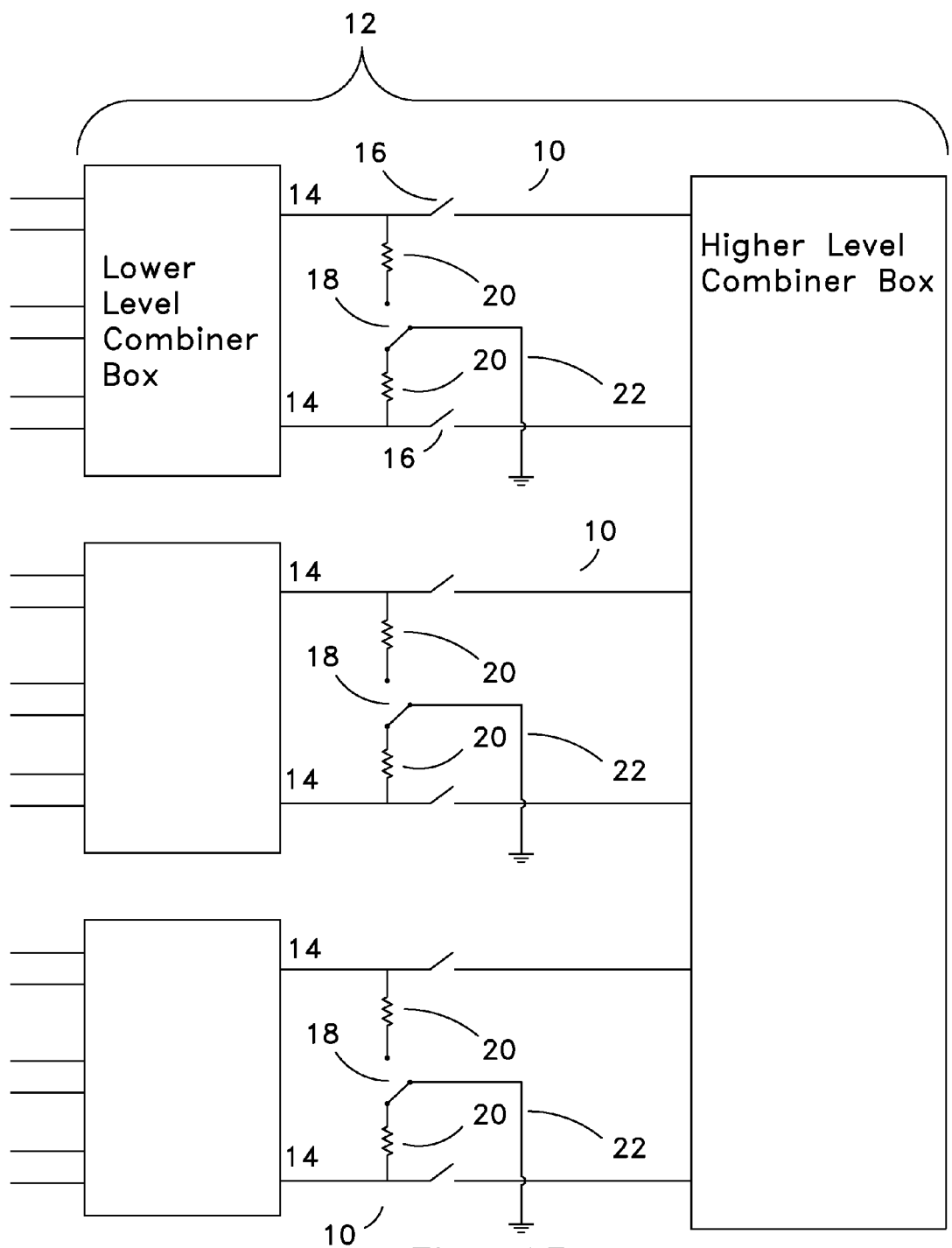
FIG. 15 shows a particular application of an embodiment of the inventive detection circuit as applied between a lower level combiner box as the module side componentry and a higher level combiner box as the inverter side componentry.

Accordingly, the invention, in particular embodiments, may be described as an electrical circuit 10 incorporated into a photovoltaic system 12 having at least two rails 14 and enabling polarity reversal and detection of leakage current from the photovoltaic system, the electrical circuit comprising: rail disconnect switch componentry 16 able to disconnect the at least two rails; rail ground switch componentry 18 able to independently ground each of the at least two rails; at least one current limiting resistor 20 established so leakage current will pass therethrough; a ground connection 22 with the at least one current limiting resistor; and at least one current measurer 24 established to detect the leakage current (24 in FIG. 11 also represents potential sites of some of the current measurers; more particulars regarding one type of intra-string measurement systems, which may provide the advantage of precise faulty module assembly location information, may be as described elsewhere herein relative to measured, instantaneous current difference based detection systems). Switch componentry may include more than one switch, and indeed any of a wide variety of switches (e.g., single pole, single throw, changeover switches, as but two of many examples). It is of note that the current limiting resistor(s) need not be on the grounding wire (which is from the rail ground switch to ground) itself (as in FIG. 10, e.g.), but established merely so that, when a rail is grounded, any leakage current passes through at least one current limiting resistor (see, e.g., FIG. 14, where, while still grounded, the current limiting resistors are not directly on the grounding wire). Further, as but two examples, there may be one current limiting resistor that may serves to limit current for both (or even all) grounded rails (again, typically sequentially grounded) as shown in FIG. 12, or there may be one for each grounded rail (see FIG. 14). In each, the ground connection is with the at least one current limiting resistor. While FIGS. 12 and 14 show shared ground, of course a circuit with a different ground connection dedicated to each rail is within the ambit of the inventive technology. Note also that while FIGS. 11, 12, 14 and 15 show a ground rail switch that is switched to impresses a voltage (e.g., a regulation voltage) upon the lower rail, FIG. 13 shows a ground rail switch that is switched to impress a voltage upon the upper rail.

In particular embodiments, the rail ground switch componentry enables sequential grounding of a different one of the rails of on the module side of the PV circuit, and thereby enables a reversal of polarity of module side componentry of the photovoltaic system. Such enables the impressing of a non-negligible voltage (i.e., one that is sufficient to cause current through any leakage paths that exist), such as a regulation voltage, on different portions of the system (for example, when the lower rail is grounded, a regulation is impressed on those solar module assemblies—specifically, the solar modules near the lower rail—that, during typical operation, have a much less than regulation voltage impressed on them). After isolation of the module side componentry from the inverter side componentry, the rail ground switch may be used to impress such "detectable leakage flow inducing voltage" on different groups of solar module assemblies; the connection to ground completes the circuit of such leakage paths and directs any such leakage flow through the rail ground switch to ground. Such flow can be measured anywhere it would exist, such as across the current limiting resistor or such resistor's connections with other components, along the grounded rail, or the string (perhaps using the measured, instantaneous intra-string current differential aspect of the inventive technology). Indeed, this technology can be (but need not be) combined with the measured, instantaneous intra-string current differential aspect of the inventive technology; such technologies thereby coordinated may provide a high degree of leakage location detection resolution. It is of note that the current limiting resistor (an optional, but preferred component) may serve to limit current in the event there has been, for example, a ground fault, that delivers through the rail ground switch to ground much more than a typically low leakage flow amount.

It is of note that the apparatus is incorporated into a PV circuit such that it separates module side componentry from inverter side componentry. Module side componentry that is connected directly with the inventive circuit includes but is not limited to solar power string(s), solar array, and combiner box (of any level) while inverter side componentry that is connected to the inventive apparatus includes but is not limited to an inverter and combiner box. Combiner boxes may be connected to the inventive circuit on both sides; typically, in such a case, a lower level combiner box will be directly connected on the module side of the inventive circuit and a higher level combiner box will be directly connected on the inverter component side.

It is of note that, as with any of the various technologies disclosed herein, current measurements can be made using any of the well known manners of measuring current (voltmeter across resistor of known value, ammeter, etc.). Further, FIG. 13 shows one possible embodiment, with only one current limiting resistor, while FIG. 14 shows another possible embodiment, with two current limiting resistors. Circuits other than those shown in the figures could also accomplish the goals of this aspect of the inventive technology. It is of note that, as with any of the various technologies disclosed herein, the rail grounding test technology may be applied to, e.g., traditional (mono-polar) circuit architecture and bipolar circuit architecture.

A corollary circuit testing method for detecting leakage current from a photovoltaic system having at least two rails may comprise the steps of: disconnecting the at least two rails from inverter side componentry; grounding a first of the at least two rails through the use of rail ground switch componentry; monitoring for leakage current from the photovoltaic system (e.g., with a current measurer on the ground connection, perhaps across the current limiting resistor(s), or on the strings of solar modules); grounding a second of the at least two rails through use of the rail ground switch componentry, thereby reversing polarity of monitor side componentry; and repeating the step of monitoring for leakage current from the photovoltaic system. It is of note that the testing may be done repeatedly throughout daylight hours, as often as is desired. Of course, a positive measured value of current through the current limiting resistor (or through the rail ground switch) will, perhaps if above a threshold, signal the presence of leakage, which may foretell ground fault, and as such, may warrant shutdown isolation, or current limitation of the faulty portion of the array (whether that be string if only the faulty string is known, substring if only the faulty substring is known, or serially connected solar module assembly if the faulty component has been identified to such a high resolution location level).

A related, manufacturing method may be described as electrical circuit method for leakage current detection comprising the steps of: establishing rail disconnect switch componentry to disconnect all rails of a solar power circuit from inverter side componentry; establishing rail ground switch componentry to independently and sequentially ground each of the rails; establishing at least one current limiting resistor so that the leakage current of a module side of the solar power circuit will pass therethrough; and establishing at least one current measurer to detect the leakage current. Such steps may be performed by PV system manufacturers or installation companies, or PV system owners. It is of note that this invention may, in particular apparatus and method embodiments, be retrofitted onto existing PV systems. It is also of note that where a step is expressed as establishing a component so that it can accomplish some task or enable achievement of some goal, examples of what type of circuits accomplish such task or enable such goal may be found in the figures and in the description provided herein.

Figure 16:
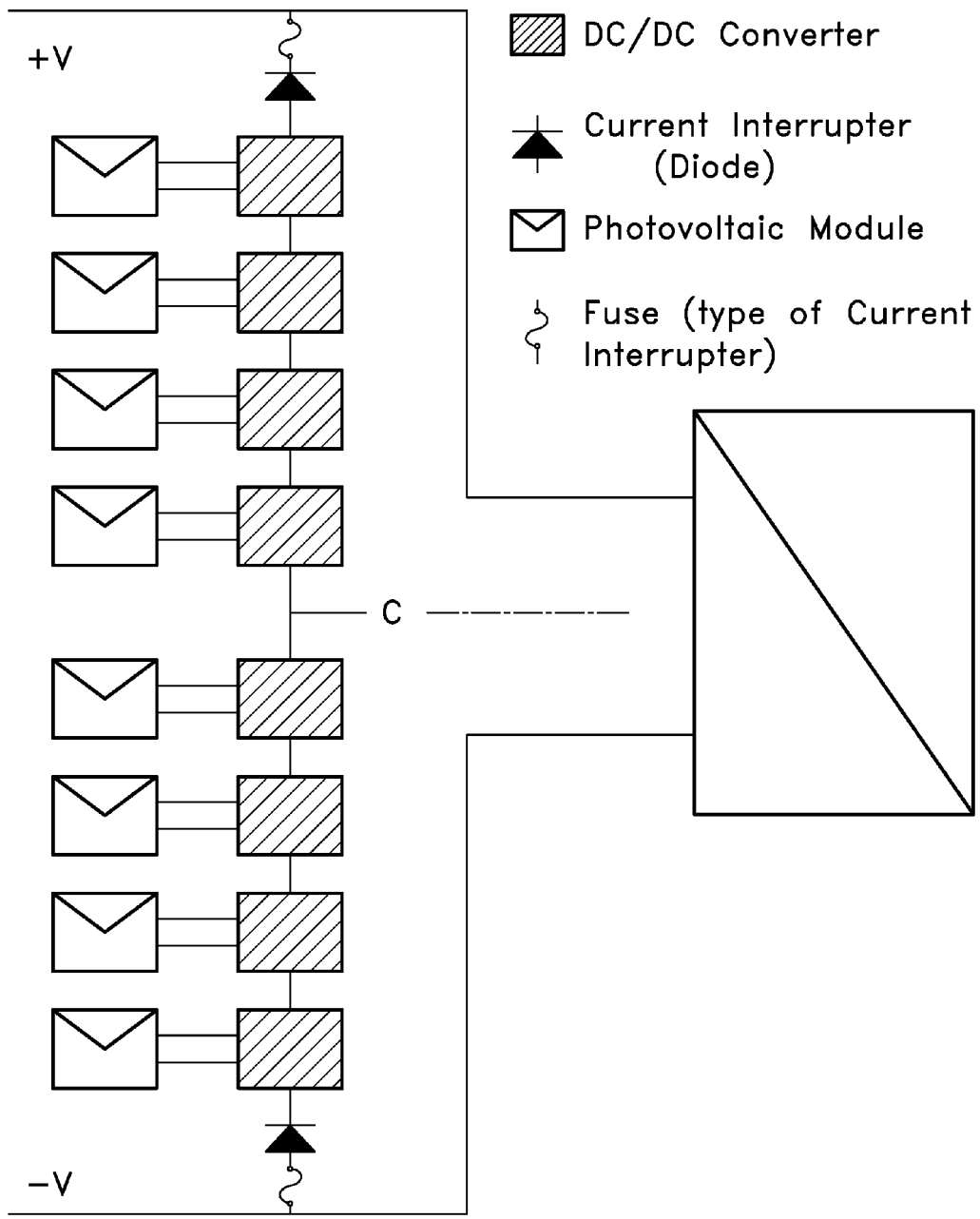
FIG. 16 shows an embodiment of the inventive current interrupter technology.
Figure 17:
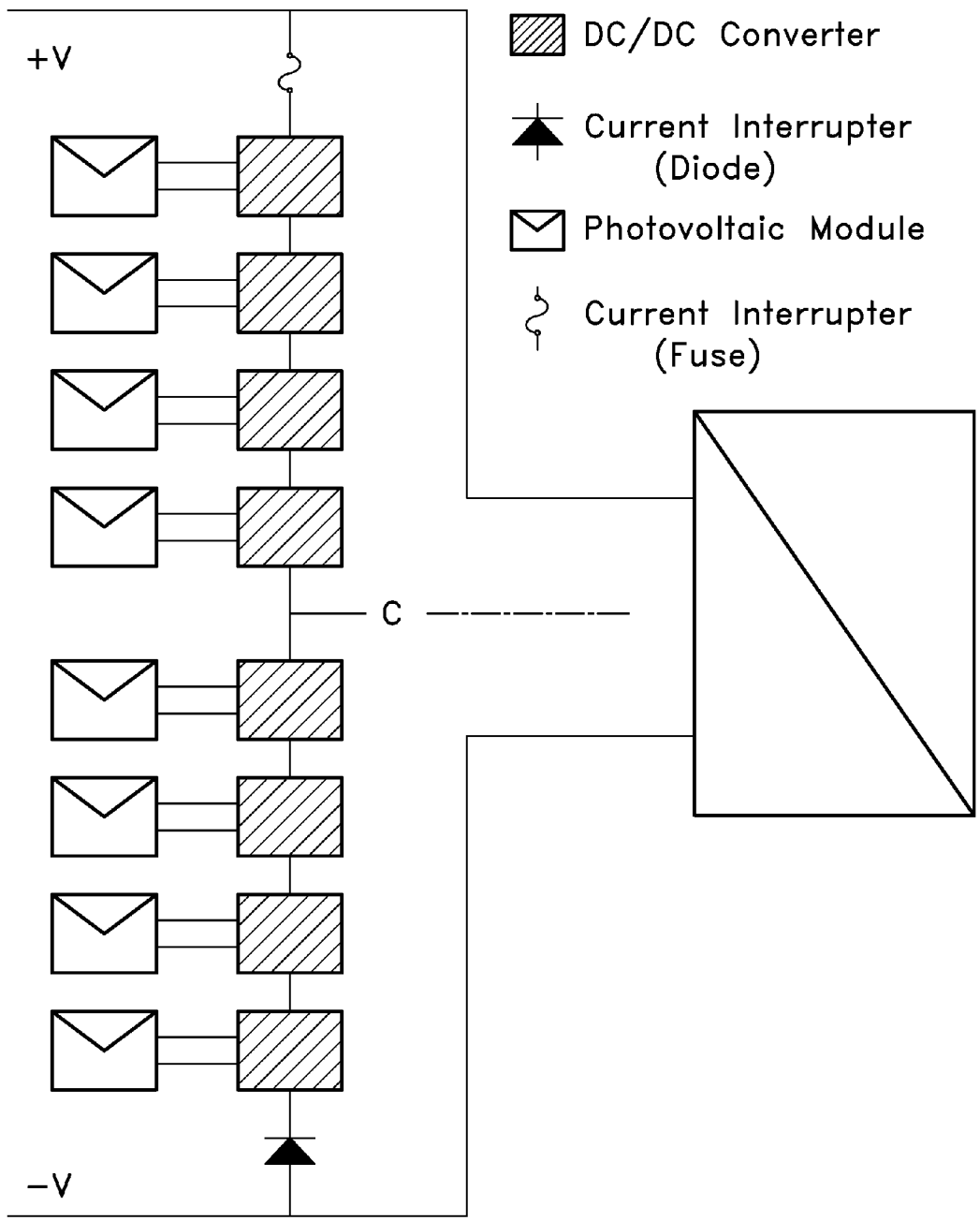
FIG. 17 shows another embodiment of the inventive current interrupter technology.

Current Interruption Technology:

Once a leakage path occurs, the distributed DC/DC converter system described herein and in the incorporated references can provide protection features to isolate the ground faulted string and prevent the system from being damaged. In particular, embodiments utilizing current interrupters as disclosed herein may prevent power form the entire array from passing into a single string (which is a hazardous condition). Accordingly, current interruptor(s) (e.g., blocking diode, perhaps as illustrated in FIG. 1, 16 or 17), could provide a new level of protection for a string experiencing a ground fault condition. When a short or the like is experienced midstring due to a leakage path, the modules between the ground fault and the upper rail have the potential to be reverse-biased, and damaged. The current interruptor(s) would be able to prevent these modules from being damage by blocking the reverse flow of current through the modules.

Many effects created by parallel arc faults and ground faults can be devastating on a photovoltaic system and its surrounding environment. Depending on how the system faults, entire array power can be routed, unintentionally, to the faulted location, thereby creating a potentially hazardous situation (indeed, fires have been attributed to parallel arc faults and/or ground faults in PV systems). By adding a current interrupter (e.g., a blocking diode and/or a fuse) to both sides of a photovoltaic string, it is possible to prevent the possibly hazardous effects of a parallel or ground fault. Note that, depending on the degree of protection sought, either only one or, instead, two (or maybe even more) current interrupters can be established at string ends (before points of contact with rails). It is of note that any combination of diode and fuse can be used. As to operation, when a parallel fault or ground fault occurs, it is possible that array current, which is much greater than is typically seen on a single photovoltaic string, can travel to the faulted location. In such case, the extra current would trip any fuse on the string. If a blocking diode is installed on the string then the diode on the positive rail (or high potential side) of the photovoltaic system, it will prevent current from flowing back into the string. A diode on the bottom side (or the low potential side, near the lower potential rail) of the array will become reverse biased when there is a fault at a higher potential than its location, thereby preventing the flow of current into the string.

Accordingly, a solar module array may include: a string of serially connected solar module assemblies, the string connected between a lower potential rail and a higher potential rail, the string having a lower potential end and a higher potential end, wherein one of the serially connected solar module assemblies is nearest the lower potential rail and another of the serially connected solar module assemblies is nearest the higher potential rail. In order to achieve the aforementioned safety benefits, the apparatus may further include at least one lower potential string end current interrupter established at the lower potential end of the string between the serially connected solar module assembly that is nearest the lower potential rail and the lower potential rail; and at least one higher potential string end current interrupter established at the higher potential end of the string between the serially connected solar module assembly that is nearest the higher potential rail and the higher potential rail. Note that a current interrupter, as used herein, is any device that, under certain conditions (e.g., excessively high voltage, current and/or reverse bias), will prevent current flow in at least one direction. They include but are not limited to diodes and fuses (or circuit breakers). It is of note that more than one lower potential string end current interrupter (the current interrupter near the lower potential rail) may be used (as is also the case with the higher potential string end current interrupter). Such may provide additional safety, provide redundant protection, and/or better comply with regulation at times (some code may consider a diode alone as inadequate for blocking current). Of course, the inventive current interrupter technology can be used on any PV system with strings of module assemblies, regardless of whether they have converters in each assembly or not, regardless of whether the strings include any converters or not, regardless of whether the strings include substrings, and regardless of whether the array is mono-polar (traditional) or bipolar. Indeed, all aspects of the inventive technologies disclosed herein may be used on a wide variety of PV system architecture.

A related solar module array safety method for use on solar array having at least one string of serially connected solar module assemblies, the at least one string connected between a lower potential rail and a higher potential rail, the at least one string having a lower potential end and a higher potential end, wherein one of the serially connected solar module assemblies is nearest the lower potential rail and another of the serially connected solar module assemblies is nearest the higher potential rail, may be described as comprising the steps of: establishing at least one lower potential string end current interrupter at the lower potential end of the string between the serially connected solar module assembly that is nearest the lower potential rail and the lower potential rail;

and establishing at least one higher potential string end current interrupter at the higher potential end of the string between the serially connected solar module assembly that is nearest the higher potential rail and the higher potential rail. As with the corollary apparatus, there may be one or more than one current interrupter at each string end, and among the different types of current interrupters that may be used are diodes and fuses.

Ideas, circuitry and means have been disclosed which may make it possible to detect a variety of forms of unwanted current paths in conventional arrays. In partial, nonlimiting summary, and as to some, perhaps in addition to the description provided elsewhere herein, possible embodiments can include the following:

Measurement of current through series elements of a PV string.

Evaluation if the current varies in the string perhaps indicative of an unwanted path which may need attention.

Circuits and means for changing the voltage on a PV array.

Simulating all, or some, conditions which may occur during a fault event.

Measurement and perhaps characterization of an array in a manner that might show potential problems if a fault occurred.

Characterization which may occur when the array is fully powered or may be tested when the inverter is not powered.

The use of current interrupters to isolate strings in the event of a fault.

The use of converter voltage limits perhaps to minimize negative consequences of a fault.

The use of converter overcurrent limits to limit current during a fault.

A central form of computing to aggregate information and identify potential faults or risks to an array.

Means to communicate to the owner/custodian of a system that maintenance (possibly immediate) needs to be completed.

Means to gage risk of future system breakdown, whether due to ground fault or for other operational abnormality.

Fault measurement perhaps via differential mode current detectors.

Fault measurement perhaps via differential current detection of a PV module output.

Fault measurement perhaps via differential current detection of a DC/DC converter input.

Of course, as can be appreciated, not all aspects may need to be described with particularity herein. One skilled in the art may use these to design and/or implement a variety of solar PV array systems. Such may be much safer from the destructive consequences of fault conditions. In achieving some diagnostic aspects, it can also be that many of these detection schemes could be performed at night. For example the rails could be tied together, powered by an external power supply and have the leakage current for the whole array measured. This would not interfere with the normal daily energy production of the PV array.

As can be easily understood from the foregoing, the basic concepts of the present invention may be embodied in a variety of ways. It involves both anticipating unwanted ground faults and potential ground fault techniques as well as devices to accomplish the appropriate detection of a variety of forms of unwanted current paths in conventional and other photovoltaic arrays. In this application, the act of anticipating unwanted ground faults and potential ground fault techniques are disclosed as part of the steps and results shown to be possible by the various devices described and as steps which are inherent to utilization. In addition, while some devices are disclosed, it should be understood that these not only accomplish certain methods but also can be varied in a number of ways. Importantly, as to all of the foregoing, all of these facets should be understood to be encompassed by this disclosure.

The discussion included in this application is intended to serve as a basic description. The reader should be aware that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in and should be appreciated from this disclosure. Where the invention is described in device-oriented terminology, each element of the devices implicitly performs a function. Apparatus claims may not only be included for the devices described, but also method or process claims may be included to address the functions the invention and each element performs. Neither the description nor the terminology is intended to limit the scope of the claims that will be included in any subsequent patent application.

It should also be understood that a variety of changes may be made without departing from the essence of the invention. Such changes are also implicitly included in the description. They still fall within the scope of this invention. A broad disclosure encompassing both the explicit embodiment(s) shown, the great variety of implicit alternative embodiments, and the broad methods or processes and the like are encompassed by this disclosure and may be relied upon when drafting the claims for any subsequent patent application. It should be understood that such language changes and broader or more detailed claiming may be accomplished at a later date (such as by any required deadline) or in the event the applicant subsequently seeks a patent filing based on this filing. With this understanding, the reader should be aware that this disclosure is to be understood to support any subsequently filed patent application that may seek examination of as broad a base of claims as deemed within the applicant's right and may be designed to yield a patent covering numerous aspects of the invention both independently and as an overall system.

Further, each of the various elements of the invention and claims may also be achieved in a variety of manners. Additionally, when used or implied, an element is to be understood as encompassing individual as well as plural structures that may or may not be physically connected. This disclosure should be understood to encompass each such variation, be it a variation of an embodiment of any apparatus embodiment, a method or process embodiment, or even merely a variation of any element of these. Particularly, it should be understood that as the disclosure relates to elements of the invention, the words for each element may be expressed by equivalent apparatus terms or method terms—even if only the function or result is the same. Such equivalent, broader, or even more generic terms should be considered to be encompassed in the description of each element or action. Such terms can be substituted where desired to make explicit the implicitly broad coverage to which this invention is entitled. As but one example, it should be understood that all actions may be expressed as a means for taking that action or as an element which causes that action. Similarly, each physical element disclosed should be understood to encompass a disclosure of the action which that physical element facilitates. Regarding this last aspect, as but one example, the disclosure of a "detector" should be understood to encompass disclosure of the act of "detecting"—whether explicitly discussed or not—and, conversely, were there effectively disclosure of the act of "detecting", such a disclosure should be understood to encompass disclosure of a "detector" and even a "means for detecting" Such changes and alternative terms are to be understood to be explicitly included in the description.

Any patents, publications, or other references mentioned in this application for patent are hereby incorporated by reference. Any priority case(s) claimed by this application is hereby appended and hereby incorporated by reference. In addition, as to each term used it should be understood that unless its utilization in this application is inconsistent with a broadly supporting interpretation, common dictionary definitions should be understood as incorporated for each term and all definitions, alternative terms, and synonyms such as contained in the Random House Webster's Unabridged Dictionary, second edition are hereby incorporated by reference. Finally, all references listed below or other information statement filed with the application are hereby appended and hereby incorporated by reference, however, as to each of the above, to the extent that such information or statements incorporated by reference might be considered inconsistent with the patenting of this/these invention(s) such statements are expressly not to be considered as made by the applicant(s) relative to this invention.

REFERENCES TO BE INCORPORATED BY REFERENCE

| U.S. PATENTS | | |
| --- | --- | --- |
| Patent Number and Kind Code | Issue Date | Name of Patentee or Applicant of cited Document |
| 7,605,498 B2 | 2009/10/20 | Ledenev et al. |
| 7,719,140 B2 | 2010/05/18 | Ledenev et al. |
| 7,843,085 B2 | 2010/11/30 | Ledenev et al. |

| U.S. PATENT APPLICATION PUBLICATIONS | | |
| --- | --- | --- |
| Publication Number and Kind Code | Publication Date | Name of Patentee or Applicant of cited Document |
| 20100229915 A1 | 2010-09-15 | Ledenev et al. |
| 20100246230 A1 | 2010-09-30 | Porter et al. |
| 20100253150 A1 | 2010-10-07 | Ledenev et al. |
| 20100308662 A1 | 2010-12-09 | Schatz et al. |

| FOREIGN PATENT DOCUMENTS | | | |
| --- | --- | --- | --- |
| Foreign Document Number and Kind Code | Country Code | Publication Date | Name of Patentee or Applicant of cited Document |
| 2009051853 A1 | WO | 2009-04-23 | AMPT, LLC |
| 2009055474 A1 | WO | 2009-04-30 | AMPT, LLC |
| 2009051854 A1 | WO | 2009-04-23 | AMPT, LLC |
| 2009051870 A1 | WO | 2009-04-23 | AMPT, LLC |
| 2011049985 A1 | WO | 2011-04-28 | AMPT, LLC |

| NONPATENT LITERATURE DOCUMENTS |
| --- |
| Provisional Application Number 61/536,440, filed Sep. 19, 2011, entitled Improved Solar Power System Data Handling Methods |

Thus, the applicant(s) should be understood to have support to claim and make a statement of invention to at least: i) each of the ground fault techniques and potential ground fault detection devices as herein disclosed and described, ii) the related methods disclosed and described, iii) similar, equivalent, and even implicit variations of each of these devices and methods, iv) those alternative designs which accomplish each of the functions shown as are disclosed and described, v) those alternative designs and methods which accomplish each of the functions shown as are implicit to accomplish that which is disclosed and described, vi) each feature, component, and step shown as separate and independent inventions, vii) the applications enhanced by the various systems or components disclosed, viii) the resulting products produced by such systems or components, ix) each system, method, and element shown or described as now applied to any specific field or devices mentioned, x) methods and apparatuses substantially as described hereinbefore and with reference to any of the accompanying examples, xi) the various combinations and permutations of each of the elements disclosed, xii) each potentially dependent claim or concept as a dependency on each and every one of the independent claims or concepts presented, and xiii) all inventions described herein.

In addition and as to computer aspects and each aspect amenable to programming or other electronic automation, the applicant(s) should be understood to have support to claim and make a statement of invention to at least: xv) processes performed with the aid of or on a computer as described throughout the above discussion, xvi) a programmable apparatus as described throughout the above discussion, xvii) a computer readable memory encoded with data to direct a computer comprising means or elements which function as described throughout the above discussion, xviii) a computer configured as herein disclosed and described, xix) individual or combined subroutines and programs as herein disclosed and described, xx) a carrier medium carrying computer readable code for control of a computer to carry out separately each and every individual and combined method described herein or in any claim, xxi) a computer program to perform separately each and every individual and combined method disclosed, xxii) a computer program containing all and each combination of means for performing each and every individual and combined step disclosed, xxiii) a storage medium storing each computer program disclosed, xxiv) a signal carrying a computer program disclosed, xxv) the related methods disclosed and described, xxvi) similar, equivalent, and even implicit variations of each of these systems and methods, xxvii) those alternative designs which accomplish each of the functions shown as are disclosed and described, xxviii) those alternative designs and methods which accomplish each of the functions shown as are implicit to accomplish that which is disclosed and described, xxix) each feature, component, and step shown as separate and independent inventions, and xxx) the various combinations and permutations of each of the above.

With regard to claims whether now or later presented for examination, it should be understood that for practical reasons and so as to avoid great expansion of the examination burden, the applicant may at any time present only initial claims or perhaps only initial claims with only initial dependencies. The office and any third persons interested in potential scope of this or subsequent applications should understand that broader claims may be presented at a later date in this case, in a case claiming the benefit of this case, or in any continuation in spite of any preliminary amendments, other amendments, claim language, or arguments presented, thus throughout the pendency of any case there is no intention to disclaim or surrender any potential subject matter. It should be understood that if or when broader claims are presented, such may require that any relevant prior art that may have been considered at any prior time may need to be re-visited since it is possible that to the extent any amendments, claim language, or arguments presented in this or any subsequent application are considered as made to avoid such prior art, such reasons may be eliminated by later presented claims or the like. Both the examiner and any person otherwise interested in existing or later potential coverage, or considering if there has at any time been any possibility of an indication of disclaimer or surrender of potential coverage, should be aware that no such surrender or disclaimer is ever intended or ever exists in this or any subsequent application. Limitations such as arose in Hakim v. Cannon Avent Group, PLC, 479 F.3d 1313 (Fed. Cir 2007), or the like are expressly not intended in this or any subsequent related matter. In addition, support should be understood to exist to the degree required under new matter laws—including but not limited to European Patent Convention Article 123(2) and United States Patent Law 35 USC 132 or other such laws—to permit the addition of any of the various dependencies or other elements presented under one independent claim or concept as dependencies or elements under any other independent claim or concept. In drafting any claims at any time whether in this application or in any subsequent application, it should also be understood that the applicant has intended to capture as full and broad a scope of coverage as legally available. To the extent that insubstantial substitutes are made, to the extent that the applicant did not in fact draft any claim so as to literally encompass any particular embodiment, and to the extent otherwise applicable, the applicant should not be understood to have in any way intended to or actually relinquished such coverage as the applicant simply may not have been able to anticipate all eventualities; one skilled in the art, should not be reasonably expected to have drafted a claim that would have literally encompassed such alternative embodiments.

Further, if or when used, the use of the transitional phrase "comprising" is used to maintain the "open-end" claims herein, according to traditional claim interpretation. Thus, unless the context requires otherwise, it should be understood that the term "comprise" or variations such as "comprises" or "comprising", are intended to imply the inclusion of a stated element or step or group of elements or steps but not the exclusion of any other element or step or group of elements or steps. Such terms should be interpreted in their most expansive form so as to afford the applicant the broadest coverage legally permissible. The use of the phrase, "or any other claim" is used to provide support for any claim to be dependent on any other claim, such as another dependent claim, another independent claim, a previously listed claim, a subsequently listed claim, and the like. As one clarifying example, if a claim were dependent "on claim 20 or any other claim" or the like, it could be re-drafted as dependent on claim 1, claim 15, or even claim 25 (if such were to exist) if desired and still fall with the disclosure. It should be understood that this phrase also provides support for any combination of elements in the claims and even incorporates any desired proper antecedent basis for certain claim combinations such as with combinations of method, apparatus, process, and the like claims.

Finally, any claims set forth at any time are hereby incorporated by reference as part of this description of the invention, and the applicant expressly reserves the right to use all of or a portion of such incorporated content of such claims as additional description to support any of or all of the claims or any element or component thereof, and the applicant further expressly reserves the right to move any portion of or all of the incorporated content of such claims or any element or component thereof from the description into the claims or vice-versa as necessary to define the matter for which protection is sought by this application or by any subsequent continuation, division, or continuation-in-part application thereof, or to obtain any benefit of, reduction in fees pursuant to, or to comply with the patent laws, rules, or regulations of any country or treaty, and such content incorporated by reference shall survive during the entire pendency of this application including any subsequent continuation, division, or continuation-in-part application thereof or any reissue or extension thereon.

What is claimed is:

1. A method of detecting operational abnormality within a solar power array that comprises at least one power generating string, said at least one power generating string comprising a plurality of serially connected solar module assemblies, said method comprising the steps of:
    determining at least one measured, instantaneous intra-string current difference for each of said at least one power generating string,
    wherein each of said at least one measured, instantaneous intra-string current difference is an instantaneous difference in string current between a respective two points on said at least one power generating string;
    assessing the presence of said operational abnormality between said respective two points based on said measured, instantaneous intra-string current difference; and
    repeating said steps of determining and assessing.

2. A method of detecting operational abnormality within a solar power array as described in claim 1 wherein said step of determining comprises the step of determining at least two measured, instantaneous intra-string current differences for at least one of said at least one power generating string, each of said at least two measured, instantaneous intra-string current differences associated with a different respective two points on said at least one of said at least one power generating string.

3. A method of detecting operational abnormality within a solar power array as described in claim 2 wherein said each of said at least two measured, instantaneous intra-string current differences are associated with a different said serially connected module assembly.

4. A method of detecting operational abnormality within a solar power array as described in claim 2 wherein each of said different respective two points is associated with a different said string connected solar module assembly.

5. A method of detecting operational abnormality within a solar power array as described in claim 1 wherein said step of determining comprises the step of determining a plurality of measured, instantaneous intra-string current differences for at least one of said at least one power generating string.

6. A method of detecting operational abnormality within a solar power array as described in claim 5 wherein said at least one of said at least one power generating string comprises n number of said serially connected solar module assemblies.

7. A method of detecting operational abnormality within a solar power array as described in claim 6 wherein said step of determining comprises the step of determining n number of measured, instantaneous intra-string current differences for said at least one of said at least one power generating string.

8. A method of detecting operational abnormality within a solar power array as described in claim 7 further comprising the step of identifying which particular serially connected module assembly is causing an operational abnormality.

9. A method of detecting operational abnormality within a solar power array as described in claim 7 wherein each of said serially connected solar module assemblies of said at least one of said at least one power generating string includes a converter.

10. A method of detecting operational abnormality within a solar power array as described in claim 9 wherein a majority of the measured, instantaneous intra-string current differences of said at least one of said at least one power generation string is a difference between measured output currents of a respective two neighboring converters.

11. A method of detecting operational abnormality within a solar power array as described in claim 9 wherein said difference between output measured currents of said two neighboring converters is a difference between negative output currents of said respective two neighboring converters.

12. A method of detecting operational abnormality within a solar power array as described in claim 11 wherein the measured, instantaneous intra-string current difference for the serially connected solar module assembly nearest a higher potential rail is determined from measurements of negative converter input current, negative converter output current, converter input voltage, and converter output voltage.

13. A method of detecting operational abnormality within a solar power array as described in claim 9 wherein said difference between output measured currents of said two neighboring converters is a difference between positive output currents of said respective two neighboring converters.

14. A method of detecting operational abnormality within a solar power array as described in claim 13 wherein the measured, instantaneous intra-string current difference for the serially connected solar module assembly nearest a lower potential rail is determined from measurements of positive converter input current, positive converter output current, converter input voltage, and converter output voltage.

15. A method of detecting operational abnormality within a solar power array as described in claim 9 wherein a majority of the respective two points on said at least one of said at least one power generating string are an output current point of said respective two neighboring converters.

16. A method of detecting operational abnormality within a solar power array as described in claim 6 wherein none of said string connected module assemblies of said at least one of said at least one power generating string includes a converter.

17. A method of detecting operational abnormality within a solar power array as described in claim 1 wherein at least one of said at least one power generating string comprises at least two substrings.

18. A method of detecting operational abnormality within a solar power array as described in claim 17 wherein said at least one of said at least one power generating string comprises at least one string converter established as part of each of said at least two substrings.

19. A method of detecting operational abnormality within a solar power array as described in claim 18 wherein said step of determining comprises the step of determining a difference between converter output currents.

20. A method of detecting operational abnormality within a solar power array as described in claim 18 wherein said step of determining comprises the step of determining a difference between converter inputs.

21. A method of detecting operational abnormality within a solar power array as described in claim 1 wherein said step of determining comprises the step of determining two measured, instantaneous intra-string current differences for at least one of said at least one power generating string.

22. A method of detecting operational abnormality within a solar power array as described in claim 1 wherein said step of determining comprises the step of determining at least one high precision, measured, instantaneous intra-string current difference for each of said power generating string.

23. A method of detecting operational abnormality within a solar power array as described in claim 1 wherein the step of assessing comprises the step of assessing the presence of leakage current from within said at least one power generating string.

24. A method of detecting operational abnormality within a solar power array as described in claim 1 wherein the step of assessing comprises the step of assessing the presence of a ground fault within said at least one power generating string.

25. A method of detecting operational abnormality within a solar power array as described in claim 1 wherein said step of assessing comprises the step of assessing the presence of arc of said at least one power generating string.

26. A method of detecting operational abnormality within a solar power array as described in claim 1 further comprising the step of locating identifying a portion of said solar power array that is causing said operational abnormality.

27. A method of detecting operational abnormality within a solar power array as described in claim 26 further comprising the step of computerized responding in response to an assessment made upon performance of said step of assessing.

28. A method of detecting operational abnormality within a solar power array as described in claim 27 wherein said step of computerized responding comprises the step of isolating said portion of said solar power array that is causing said operational abnormality.

29. A solar power circuit operable to detect operational abnormality, said circuit comprising:
    a solar power array that itself comprises at least one power generating string, said at least one power generating string comprising a plurality of serially connected solar module assemblies;
    at least one measured, instantaneous intra-string current difference determinator for each of said power generating string, each said determinator determining an instantaneous difference in string current between a respective two points on said at least one power generating string;
    operational abnormality assessment componentry that acts on data generated by said at least one measured, instantaneous intra-string current difference determinator; and
    computerized detected leakage response componentry that is responsive to said operational abnormality assessment componentry.

30. A solar power circuit operable to detect operational abnormality as described in claim 29 wherein said at least one measured, instantaneous intra-string current difference determinator comprises a differential current measurer.

31. A solar power circuit operable to detect operational abnormality as described in claim 29 wherein said at least one measured, instantaneous intra-string current difference determinator comprises two current measurers, one at a first of said respective two points and another at a second of said respective two points.

32. A solar power circuit operable to detect operational abnormality as described in claim 31 wherein said at least one measured, instantaneous intra-string current difference determinator comprises computerized componentry that compares a current measurement at said first point with a current measurement at said second point.

33. A solar power circuit operable to detect operational abnormality as described in claim 29 wherein said at least one solar power generating string comprises no converter.

34. A solar power circuit operable to detect operational abnormality as described in claim 29 wherein said at least one solar power generating string comprises only one converter.

35. A solar power circuit operable to detect operational abnormality as described in claim 29 wherein said at least one solar power generating string comprises more than one converter.

36. A solar power circuit operable to detect operational abnormality as described in claim 35 wherein said at least one solar power generating string comprises one converter per said serially connected solar module assemblies.

37. A solar power circuit operable to detect operational abnormality as described in claim 36 further comprising measurement componentry configured to measure a converter input current, a converter output current, converter input voltage and converter output voltage of a converter of a serially connected module assembly that is nearest one rail of said at least one solar power generating string of said solar panel array.

38. A solar power circuit operable to detect operational abnormality as described in claim 29 wherein said at least one solar power generating string comprises no substrings.

39. A solar power circuit operable to detect operational abnormality as described in claim 29 wherein said at least one solar power generating string comprises a plurality of substrings.

40. A solar power circuit operable to detect operational abnormality as described in claim 29 further comprising computerized data handling componentry configured to handle data generated by said at least one measured, instantaneous intra-string current difference determinator.

\* \* \* \* \*